(12) United States Patent
Brown

(10) Patent No.: US 11,762,635 B2
(45) Date of Patent: Sep. 19, 2023

(54) ARTIFICIAL INTELLIGENCE ENGINE WITH ENHANCED COMPUTING HARDWARE THROUGHPUT

(71) Applicant: Microsoft Technology Licensing, LLC, Redmond, WA (US)

(72) Inventor: Matthew Brown, Berkeley, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1231 days.

(21) Appl. No.: 16/008,775

(22) Filed: Jun. 14, 2018

(65) Prior Publication Data

US 2018/0293463 A1 Oct. 11, 2018

Related U.S. Application Data

(63) Continuation-in-part of application No. 15/417,086, filed on Jan. 26, 2017, now Pat. No. 10,803,401.
(Continued)

(51) Int. Cl.
*G06F 9/48* (2006.01)
*G06F 9/50* (2006.01)
(Continued)

(52) U.S. Cl.
CPC ............. *G06F 8/31* (2013.01); *G06F 3/0482* (2013.01); *G06F 8/311* (2013.01); *G06F 8/38* (2013.01);
(Continued)

(58) Field of Classification Search
None
See application file for complete search history.

(56) References Cited

U.S. PATENT DOCUMENTS 5,581,662 A 12/1996 Furuta et al.
5,619,618 A 4/1997 Bigus
(Continued)

FOREIGN PATENT DOCUMENTS

AU 2001251476 A8 10/2001
CN 101645083 A 2/2010
(Continued)

OTHER PUBLICATIONS

"Summons to Attend Oral Proceedings Issued in European Patent Application No. 17745030.1", dated Feb. 25, 2022, 6 Pages.
(Continued)

*Primary Examiner* — Abu Zar Ghaffari
(74) *Attorney, Agent, or Firm* — Alleman Hall Creasman & Tuttle LLP

(57) ABSTRACT

An artificial intelligence ("AI") engine is disclosed with AI-engine modules and a plurality of learning agents. The AI-engine modules include instructor, learner, and predictor modules. The learner module is configured to train a plurality of AI models in parallel, and the instructor module is configured to coordinate with a plurality of simulators for respectively training the AI models. The learning agents are configured to process training requests from the instructor on data from the simulators for training the AI models. The learner module is further configured to first train the AI models on a first batch of similar data synchronously pooled in a memory of the learner module with a first processor. The learner module is further configured to subsequently train the AI models on a second, different batch of similar data synchronously pooled in the memory of the learner module with the first processor.

16 Claims, 14 Drawing Sheets

Related U.S. Application Data

Figure 1A:
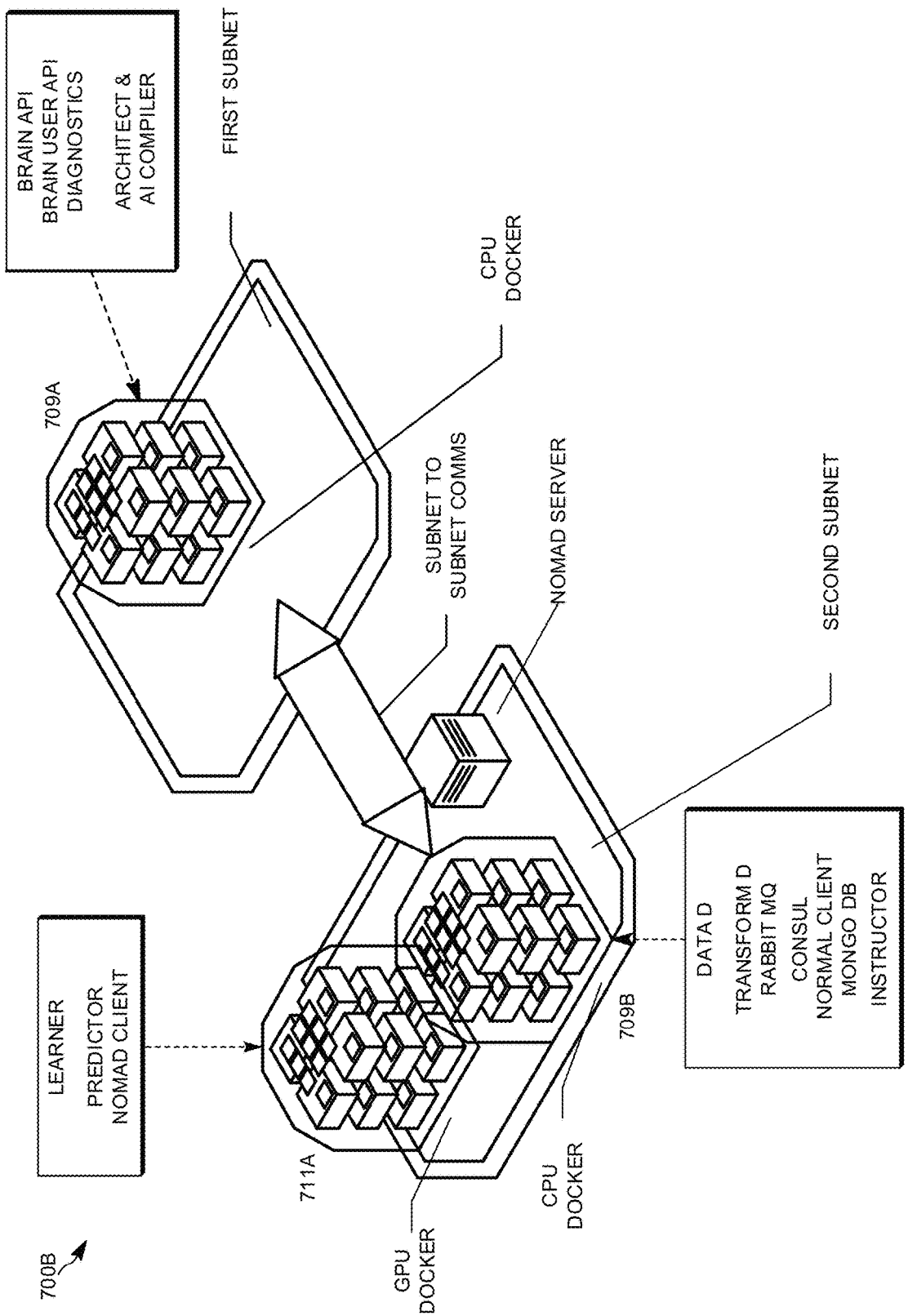

(60) Provisional application No. 62/547,339, filed on Aug. 18, 2017, provisional application No. 62/524,381, filed on Jun. 23, 2017, provisional application No. 62/287,861, filed on Jan. 27, 2016.

(51) Int. Cl.
| | | |
|---|---|---|
| *G06F 30/20* | (2020.01) | |
| *G06N 3/08* | (2023.01) | |
| *G06F 8/30* | (2018.01) | |
| *G06N 20/00* | (2019.01) | |
| *G06F 16/951* | (2019.01) | |
| *G06F 16/22* | (2019.01) | |
| *G06F 8/38* | (2018.01) | |
| *G06Q 10/00* | (2023.01) | |
| *G06N 3/10* | (2006.01) | |
| *H04L 67/01* | (2022.01) | |
| *G06F 18/214* | (2023.01) | |
| *G06N 3/045* | (2023.01) | |
| *G06F 9/451* | (2018.01) | |
| *G06F 3/0482* | (2013.01) | |
| *G06N 3/008* | (2023.01) | |
| *G06N 3/04* | (2023.01) | |
| *G06N 5/04* | (2023.01) | |
| *G06F 15/80* | (2006.01) | |
| *G06F 30/333* | (2020.01) | |
| *G06F 40/166* | (2020.01) | |
| *G06F 3/0354* | (2013.01) | |

(52) U.S. Cl.
CPC ............ *G06F 9/451* (2018.02); *G06F 9/4881* (2013.01); *G06F 9/5066* (2013.01); *G06F 15/80* (2013.01); *G06F 16/2228* (2019.01); *G06F 16/951* (2019.01); *G06F 18/2148* (2023.01); *G06F 30/20* (2020.01); *G06N 3/008* (2013.01); *G06N 3/04* (2013.01); *G06N 3/045* (2023.01); *G06N 3/08* (2013.01); *G06N 3/105* (2013.01); *G06N 5/04* (2013.01); *G06N 20/00* (2019.01); *G06Q 10/00* (2013.01); *H04L 67/01* (2022.05); *G06F 3/03543* (2013.01); *G06F 30/333* (2020.01); *G06F 40/166* (2020.01)

(56) References Cited

U.S. PATENT DOCUMENTS

| | | | |
|---|---|---|---|
| 5,681,496 A | 10/1997 | Brownlow et al. | |
| 6,449,603 B1 | 9/2002 | Hunter | |
| 7,016,881 B2* | 3/2006 | Li | G06F 18/214 706/47 |
| 7,386,522 B1* | 6/2008 | Bigus | G06N 5/043 706/45 |
| 7,801,591 B1 | 9/2010 | Shusterman | |
| 7,936,915 B2 | 5/2011 | Brown et al. | |
| 8,396,286 B1 | 3/2013 | Aradhye et al. | |
| 8,442,839 B2 | 5/2013 | Yen et al. | |
| 8,521,664 B1 | 8/2013 | Lin et al. | |
| 9,213,527 B2 | 12/2015 | Krueger et al. | |
| 9,235,653 B2 | 1/2016 | Talmon et al. | |
| 9,390,404 B2 | 7/2016 | Ivanic et al. | |
| 9,443,192 B1 | 9/2016 | Cosic | |
| 9,460,088 B1 | 10/2016 | Sak et al. | |
| 9,524,461 B1 | 12/2016 | Huynh | |
| 9,558,454 B2 | 1/2017 | Strassner | |
| 10,504,030 B2 | 12/2019 | Kipersztok et al. | |
| 10,586,173 B2 | 3/2020 | Hammond et al. | |
| 10,691,843 B2 | 6/2020 | Estee et al. | |
| 10,800,040 B1 | 10/2020 | Beckman et al. | |
| 10,847,266 B1 | 11/2020 | Ross et al. | |
| 10,990,894 B2 | 4/2021 | Shaashua et al. | |
| 11,188,821 B1 | 11/2021 | Kalakrishnan et al. | |
| 11,423,454 B2 | 8/2022 | Addepalli | |
| 2003/0004672 A1 | 1/2003 | Thurman | |
| 2003/0041047 A1 | 2/2003 | Chang et al. | |
| 2003/0204311 A1 | 10/2003 | Bush | |
| 2004/0122788 A1 | 6/2004 | Griffith et al. | |
| 2004/0255291 A1 | 12/2004 | Sierer et al. | |
| 2005/0034109 A1 | 2/2005 | Hamilton et al. | |
| 2005/0114280 A1 | 5/2005 | Rising, III | |
| 2005/0125440 A1 | 6/2005 | Hirst | |
| 2005/0132032 A1 | 6/2005 | Bertrand | |
| 2005/0197991 A1 | 9/2005 | Wray et al. | |
| 2005/0238198 A1 | 10/2005 | Brown et al. | |
| 2006/0166174 A1 | 7/2006 | Rowe et al. | |
| 2006/0218107 A1 | 9/2006 | Young | |
| 2006/0271210 A1 | 11/2006 | Subbu et al. | |
| 2007/0101331 A1* | 5/2007 | Krebs | G06F 9/453 718/101 |
| 2007/0168328 A1* | 7/2007 | Peralta | G06N 3/02 |
| 2008/0298544 A1 | 12/2008 | Dugan | |
| 2009/0106165 A1 | 4/2009 | Solomon | |
| 2009/0106178 A1 | 4/2009 | Chu | |
| 2009/0119587 A1 | 5/2009 | Allen et al. | |
| 2009/0204563 A1 | 8/2009 | Gerber et al. | |
| 2010/0070948 A1 | 3/2010 | Rama et al. | |
| 2010/0088258 A1 | 4/2010 | Oaten et al. | |
| 2010/0094790 A1 | 4/2010 | Gnojewski | |
| 2010/0106714 A1 | 4/2010 | Lim et al. | |
| 2010/0232686 A1 | 9/2010 | Dewan et al. | |
| 2010/0280863 A1 | 11/2010 | Wilcock et al. | |
| 2012/0139930 A1* | 6/2012 | Rogers | G06F 9/4818 345/522 |
| 2012/0159090 A1 | 6/2012 | Andrews et al. | |
| 2012/0209794 A1 | 8/2012 | Jones, III | |
| 2012/0239598 A1 | 9/2012 | Cascaval et al. | |
| 2012/0310864 A1* | 12/2012 | Chakraborty | G06K 9/6262 706/12 |
| 2014/0302476 A1* | 10/2014 | Sorensen | G09B 7/00 434/307 R |
| 2015/0066929 A1 | 3/2015 | Satzke et al. | |
| 2015/0339570 A1 | 11/2015 | Scheffler | |
| 2016/0034809 A1 | 2/2016 | Trenholm et al. | |
| 2016/0078361 A1* | 3/2016 | Brueckner | H04L 67/10 706/12 |
| 2016/0188843 A1 | 6/2016 | Staples, II et al. | |
| 2016/0260428 A1 | 9/2016 | Matsuda et al. | |
| 2016/0283202 A1 | 9/2016 | Sellers-blais | |
| 2016/0314402 A1 | 10/2016 | Buccapatnam Tirumala et al. | |
| 2016/0358098 A1 | 12/2016 | Duesterwald et al. | |
| 2017/0019315 A1 | 1/2017 | Tapia et al. | |
| 2017/0061283 A1 | 3/2017 | Rasmussen et al. | |
| 2017/0091670 A1 | 3/2017 | Gulin et al. | |
| 2017/0193361 A1 | 7/2017 | Chilimbi et al. | |
| 2017/0213126 A1 | 7/2017 | Hammond et al. | |
| 2017/0213128 A1 | 7/2017 | Hammond et al. | |
| 2017/0213131 A1 | 7/2017 | Hammond et al. | |
| 2017/0213132 A1 | 7/2017 | Hammond et al. | |
| 2017/0213154 A1 | 7/2017 | Hammond et al. | |
| 2017/0213155 A1 | 7/2017 | Hammond et al. | |
| 2017/0213156 A1 | 7/2017 | Hammond et al. | |
| 2017/0220943 A1 | 8/2017 | Duncan et al. | |
| 2017/0262769 A1 | 9/2017 | Mcshane et al. | |
| 2017/0294027 A1 | 10/2017 | Babenko et al. | |
| 2017/0308800 A1 | 10/2017 | Cichon et al. | |
| 2018/0060759 A1 | 3/2018 | Chu et al. | |
| 2018/0191867 A1 | 7/2018 | Siebel et al. | |
| 2018/0240062 A1 | 8/2018 | Crabtree et al. | |
| 2018/0293057 A1 | 10/2018 | Sun et al. | |
| 2018/0293493 A1 | 10/2018 | Kalamkar et al. | |
| 2018/0293498 A1 | 10/2018 | Campos et al. | |
| 2018/0293517 A1 | 10/2018 | Browne et al. | |
| 2018/0307945 A1 | 10/2018 | Haigh et al. | |
| 2018/0357047 A1 | 12/2018 | Brown et al. | |
| 2018/0357152 A1 | 12/2018 | Browne et al. | |
| 2018/0357543 A1 | 12/2018 | Brown et al. | |
| 2018/0357552 A1 | 12/2018 | Campos et al. | |
| 2019/0095794 A1 | 3/2019 | Aldana López et al. | |
| 2019/0232488 A1 | 8/2019 | Levine et al. | |

(56) References Cited

U.S. PATENT DOCUMENTS

| | | |
|---|---|---|
| 2020/0117427 A1 | 4/2020 | McGloin et al. |
| 2020/0250583 A1 | 8/2020 | Hammond et al. |
| 2020/0265302 A1 | 8/2020 | Sanyal et al. |
| 2021/0042530 A1 | 2/2021 | Kim et al. |
| 2021/0248514 A1 | 8/2021 | Cella et al. |
| 2021/0406774 A1 | 12/2021 | Browne et al. |
| 2022/0138656 A1 | 5/2022 | Le et al. |
| 2022/0164879 A1 | 5/2022 | Cella |
| 2022/0172050 A1 | 6/2022 | Dalli et al. |

FOREIGN PATENT DOCUMENTS

| | | |
|---|---|---|
| CN | 102075560 A | 5/2011 |
| CN | 102141991 A | 8/2011 |
| CN | 102222005 A | 10/2011 |
| CN | 102509039 A | 6/2012 |
| CN | 102591654 A | 7/2012 |
| CN | 102707982 A | 10/2012 |
| CN | 104106276 A | 10/2014 |
| CN | 104520880 A | 4/2015 |
| CN | 104965978 A | 10/2015 |
| CN | 105068661 A | 11/2015 |
| WO | 2015017706 A2 | 2/2015 |

OTHER PUBLICATIONS

"Non-Final Office Action Issued in U.S. Appl. No. 15/416,904", dated Aug. 14, 2019, 11 Pages.

"Notice of Allowance Issued in U.S. Appl. No. 15/417,075", dated Aug. 14, 2019, 9 Pages.

"Extended Search Report Issued in European Patent Application No. 17745025.1", dated Aug. 23, 2019, 9 Pages.

"Extended Search Report Issued in European Patent Application No. 17745016.0", dated Aug. 20, 2019, 8 Pages.

"Extended Search Report Issued in European Patent Application No. 17745030.1", dated Sep. 2, 2019, 7 Pages.

"Notice of Allowance Issued in U.S. Appl. No. 16/009,153", dated Jul. 1, 2021, 11 Pages.

"Office Action issued in European Application No. 17745025.1", dated Jul. 15, 2021, 4 Pages.

"Office Action issued in European Application No. 17745030.1", dated Jul. 15, 2021, 4 Pages.

"Non Final Office Action Issued in U.S. Appl. No. 15/416,970", dated Nov. 21, 2019, 12 Pages.

"Non Final Office Action Issued in U.S. Appl. No. 15/417,033", dated Nov. 26, 2019, 13 Pages.

"First Office Action and Search Report Issued in Chinese Patent Application No. 201780020322.4", dated Apr. 2, 2021, 12 Pages.

Arendt, et al., "A Tool Environment for Quality Assurance based on the Eclipse Modeling Framework", In Journal of Automated Software Engineering, vol. 20, Issue 2, Dec. 11, 2012, pp. 141-184.

Yang, et al., "Intelligent Search Engine Based on Knowledge Library", In Journal of Computer and Information Technology, vol. 18, Issue 2, Apr. 30, 2010, pp. 41-44.

"First Office Action and Search Report Issued in Chinese Patent Application No. 201780020323.9", dated May 24, 2021, 21 Pages.

"Non Final Office Action Issued in U.S. Appl. No. 16/009,039", dated Dec. 14, 2020, 32 Pages.

Luchian et al., "Automation of the infrastructure and services for an OpenStack deployment using chef tool", In 15th RoEduNet Conference: Networking in Education and Research, IEEE, Sep. 7, 2016, 5 Pages.

"Non Final Office Action Issued in U.S. Appl. No. 16/008,751", dated Dec. 1, 2020, 26 Pages.

"Summons to attend oral proceedings Issued in European Patent Application No. 17745016.0", dated Oct. 23, 2020, 7 Pages.

Ciancio et al., "Heuristic techniques to optimize neural network architecture in manufacturing applications", In Journal of Neural Computing and Applications vol. 27, Issue 7, Jul. 31, 2015, pp. 2001-2015.

"Non-Final Office Action Issued in U.S. Appl. No. 15/416,970", dated Aug. 4, 2020, 7 Pages.

"Office Action Issued in European Patent Application No. 17745016.0", dated Jul. 13, 2020, 9 Pages.

Lirov, Yuval., "Computer Aided Neural Network Engineering", In the Journal of Neural Networks, vol. 5, Issue 4, Jul. 1992, pp. 711-719.

Perera, et al., "ANNEbot: An Evolutionary Artificial Neural Network Framework", In the Proceedings of 4th International Conference on Intelligent and Advanced Systems, Jun. 12, 2012, pp. 40-45.

"Final Office Action Issued in U.S. Appl. No. 15/416,970", dated Mar. 3, 2020, 7 Pages.

"Final Office Action Issued in U.S. Appl. No. 15/417,086", dated Feb. 25, 2020, 18 Pages.

"Office Action and Search Report Issued in Chinese Patent Application No. 201780020322.4", dated Oct. 26, 2021, 8 Pages.

"Office Action Issued in Chinese Patent Application No. 201780020323.9", dated Nov. 29, 2021, 6 Pages.

Campos, et al., "Concept Network Reinforcement Learning For Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.

Gudimella, et al., "Deep Reinforcement Learning For Dexterous Manipulation With Concept Networks", Retrieved From: https://arxiv.org/pdf/1709.06977.pdf, Sep. 20, 2017, 16 Pages.

Hengst, Bernhard, "Safe State Abstraction and Reusable Continuing Subtasks in Hierarchical Reinforcement Learning", In Proceedings of 20th Joint Conference on Artificial Intelligence, Dec. 2, 2007, 11 pages.

"International Search Report & Written Opinion Issued in PCT Application No. PCT/US2018/037650", dated Aug. 31, 2018, 10 Pages.

"Non Final Office Action Issued in U.S. Appl. No. 15/416,988", dated Oct. 3, 2019, 11 Pages.

"Non Final Office Action Issued in U.S. Appl. No. 15/417,056", dated Oct. 17, 2019, 10 Pages.

"Non Final Office Action Issued in U.S. Appl. No. 15/417,086", dated Nov. 7, 2019, 13 Pages.

Beale, et al., "Neural Network Toolbox 7 User's Guide", Retrieved from http://citeseerx.ist.psu.edu/viewdoc/download?doi=10.1.1.220.1640&rep=rep1&type=pdf, 2010, 951 Pages.

"Build, Ship, Run Any App, Anywhere", Retrieved From: https://web.archive.org/web/20170120165452/https://www.docker.com/, Retrieved On: Jan. 20, 2017, 7 Pages.

"Services Overview", Published By Bonsai AI, Inc, 3 Pages.

"What's The Difference Between An Application, Process, and Services?", Retrieved From: https://superuser.com/questions/209654/whats-the-difference-between-an-application-process-and-services, Retrieved On: Jan. 20, 2017, 1 Page.

Chung, Kiuk, "Generating Recommendations at Amazon Scale With Apache Spark and Amazon DSSTNE", Retrieved From: https://aws.amazon.com/blogs/big-data/generating-recommendations-at-amazon-scale-with-apache-spark-and-amazon-dsstne/, Jul. 9, 2016, 8 Pages.

Dunn, Jeffrey, "Introducing FBLearner Flow: Facebook's AI Backbone", Retrieved From: https://web.archive.org/web/20180717150507/https://code.fb.com/core-data/introducing-fbleamer-flow-facebooks-ai-backbone/, May 9, 2016, 9 Pages.

Gray, Kathryn E.., "Toward Customizable Pedagogic Programming Languages", A dissertation submitted to the faculty of The University of Utah in partial fulfillment of the requirements for the degree of Doctor of Philosophy in Computer Science, Aug. 2006, 156 Pages.

Hammond, et al., "AI For Everyone: An Introduction to Bonsai BRAIN and Inkling", In Bonsai AI, Inc. Whitepaper, Jan. 2016, 16 Pages.

He, Jinru, "Auto Scaling Pinterest", Retrieved From: https://web.archive.org/web/20161114182239/https://engineering.pinterest.com/blog/auto-scaling-pinterest, Sep. 16, 2016, 8 Pages.

Ma, Kevin, "Applying Deep Learning to Related Pins", Retrieved From: https://web.archive.org/web/20170214195127/https://engineering.pinterest.com/blog/applying-deep-learning-related-pins, Jan. 12, 2017, 6 Pages.

(56) References Cited

OTHER PUBLICATIONS

"International Search Report and Written Opinion Issued in PCT Application No. PCT/US2017/015446", dated Apr. 10, 2017, 6 Pages.
"International Search Report and Written Opinion Issued in PCT Application No. PCT/US2017/015460", dated May 5, 2017, 11 Pages.
"International Search Report and Written Opinion Issued in PCT Application No. PCT/US2017/015470", dated Apr. 21, 2017, 11 Pages.
Raschka, Sebastian, "Fitting a Model Via Closed-Form Equations Vs. Gradient Descent Vs Stochastic Gradient Descent Vs Mini-Batch Learning. What is the Difference?", Retrieved From: https://sebastianraschka.com/faq/docs/closed-form-vs-gd.html, Retrieved From: Jan. 17, 2017, 6 Pages.
Tessler, et al., "A Deep Hierarchical Approach to Lifelong Learning in Minecraft", Retrieved From: https://arxiv.org/pdf/1604.07255.pdf, Nov. 30, 2016, 10 Pages.
"Non Final Office Action Issued in U.S. Appl. No. 16/104,044", dated Jun. 24, 2022, 16 Pages.
"Non Final Office Action Issued in U.S. Appl. No. 16/104,060", dated Jul. 5, 2022, 11 Pages.
"Non Final Office Action Issued in U.S. Appl. No. 16/104,062", dated Jun. 3, 2022, 8 Pages.
"Non Final Office Action Issued in U.S. Appl. No. 16/854,687", dated Jul. 13, 2022, 6 Pages.
"Notice of Allowance Issued in European Patent Application No. 17745025.1", dated Jul. 14, 2022, 7 Pages.
Mnih, et al., "Human-Level Control through Deep Reinforcement Learning", In Journal of Nature, vol. 518, Issue 7540, Feb. 26, 2015, pp. 529-533.
Silver, et al., "Mastering the Game of Go with Deep Neural Networks and Tree Search", In Journal of Nature, vol. 529, Issue 7587, Jan. 28, 2016, pp. 484-489.
Sutton, et al., "Between MDPs and Semi-MDPs: A Framework for Temporal Abstraction in Reinforcement Learning", In Journal of Artificial Intelligence, vol. 112, Issue 1-2, Aug. 1999, pp. 181-211.
"Notice of Allowance Issued in U.S. Appl. No. 16/104,060", dated Nov. 14, 2022, 11 Pages.
"Notice of Allowance Issued in U.S. Appl. No. 16/104,062", dated Oct. 25, 2022, 7 Pages.
"Notice of Allowance Issued in U.S. Appl. No. 16/854,687", dated Nov. 23, 2022, 8 Pages.
"Notice of Allowance Issued in European Patent Application No. 17745025.1", dated Oct. 27, 2022, 2 Pages.
"First Office Action and Search report Issued in Chinese Patent Application No. 201780020299.9", dated Nov. 18, 2022, 11 Pages.
"Notice of Allowance Issued in U.S. Appl. No. 16/104,044", dated Oct. 19, 2022, 18 Pages.
"Notice of Allowance Issued in U.S. Appl. No. 17/447,642", dated Sep. 30, 2022, 10 Pages.
"Notice of Allowance Issued in U.S. Appl. No. 16/104,044", dated Jan. 31, 2023, 12 Pages.
"Notice of Allowance Issued in U.S. Appl. No. 16/104,062", dated Feb. 10, 2023, 7 Pages.
"Notice of Allowance Issued in U.S. Appl. No. 17/447,642", dated Feb. 24, 2023, 11 Pages.
"Notice of Allowance Issued in U.S. Appl. No. 16/104,060", dated Feb. 28, 2023, 10 Pages.
"Notice of Allowance Issued in U.S. Appl. No. 16/854,687", dated Mar. 8, 2023, 6 Pages.
Aug. 6, 2020, US-2020-0250583-A1.
Jul. 27, 2017, US-2017-0213154-A1.
Jul. 27, 2017, US-2017-0213128-A1.
Jul. 27, 2017, US-2017-0213131-A1.
Jul. 27, 2017, US-2017-0213132-A1.
Jul. 27, 2017, US-2017-0213126-A1.
Jul. 27, 2017, US-2017-0213155-A1.
Jul. 27, 2017, US-2017-0213156-A1.
Dec. 13, 2018, US-2018-0357552-A1.
Dec. 13, 2018, US-2018-0357543-A1.
Dec. 13, 2018, US-2018-0357047-A1.
Dec. 13, 2018, US-2018-0357152-A1.
Oct. 25, 2018, US-2018-0307945-A1.
Oct. 11, 2018, US-2018-0293498-A1.
Oct. 11, 2018, US-2018-0293517-A1.
Dec. 30, 2021, US-2021-0406774-A1.
"Non Final Office Action Issued in U.S. Appl. No. 16/104,054", dated Apr. 5, 2023, 48 Pages.
Brys, et al., "Reinforcement Learning from Demonstration through Shaping", In Proceedings of Twenty-Fourth International Joint Conference on Artificial Intelligence, Jun. 27, 2015, pp. 3352-3358.
Jankowska, et al., "Application of Perceptron Neural Networks for Fault Detection", In Journal of IFAC Proceedings Volumes, vol. 33, Issue 11, Jun. 1, 2000, pp. 207-212.
Mitri, Nicholas Gabi, "Hierarchical Temporal Memory: An Investigative Look Into A New Cortical Algorithm", In thesis Submitted to Department of Electrical and Computer Engineering, American University of Beirut, Apr. 27, 2015, 123 Pages.
Owens, et al., "A Multi-Output-Layer Perceptron", In Journal of Neural Computing & Applications, vol. 4, Mar. 1996, pp. 10-20.
"Notice of Allowance Issued in U.S. Appl. No. 16/104,062", dated May 30, 2023, 7 Pages.
"Notice of Allowance Issued in U.S. Appl. No. 16/104,060", dated Jun. 14, 2023, 8 Pages.
"Notice of Allowance Issued in U.S. Appl. No. 16/104,044", dated May 11, 2023, 12 Pages.
"Second Office Action Issued in Chinese Patent Application No. 201780020299.9", dated Jul. 8, 2023, 6 Pages.

* cited by examiner

ARTIFICIAL INTELLIGENCE ENGINE WITH ENHANCED COMPUTING HARDWARE THROUGHPUT

CROSS REFERENCE

This application is a continuation-in-part of U.S. patent application Ser. No. 15/417,086 titled "An artificial intelligence engine having multiple independent processes on a cloud-based platform configured to scale," filed Jan. 26, 2017, which claims the benefit of U.S. Provisional Application No. 62/287,861, filed Jan. 27, 2016, titled "Bonsai platform, language, and tooling," each of which is incorporated herein by reference in its entirety. This application also claims the benefit under 35 USC 119 of U.S. Provisional Application No. 62/524,381, titled "Systems and methods for extending functionality of trained machine-learning models, filed Jun. 23, 2017, and U.S. Provisional Application No. 62/547,339 titled "An artificial intelligence engine having multiple improvements," filed Aug. 18, 2017, each of which is incorporated herein by reference in its entirety.

NOTICE OF COPYRIGHT

A portion of the disclosure of this patent application contains material that is subject to copyright protection. The copyright owner has no objection to the facsimile reproduction by anyone of the material subject to copyright protection as it appears in the United States Patent & Trademark Office's records for this application, but otherwise reserves all copyright rights whatsoever.

FIELD

Embodiments of the design provided herein generally relate to artificial intelligence ("AI") systems and methods thereof.

BACKGROUND

AI has potential to be one of the most impactful technologies of the $21^{st}$ century and beyond. Unfortunately, software developers currently looking to work with AI must learn complex toolkits, use limited application programming interfaces ("APIs"), use constrained black-box solutions for AI, or some combination thereof. The foregoing limitations must be overcome for software developers and enterprises to solve real-world problems with AI. In addition, with fewer than, for example, 20,000 data science experts capable of building AI at its lowest levels, working with AI needs to be made more accessible to, for example, the 2 million or more software developers of the software development community. Provided herein are AI systems and methods that address the foregoing.

SUMMARY

Provided herein, in an embodiment, is an artificial intelligence ("AI") engine resident on one or more computer platforms with one or more processors such as CPUs, GPUs, DSPs, or a combination thereof. The AI engine includes one or more AI-engine modules in a memory including an instructor module, a learner module, and a predictor module, as well as a number of learning agents. Upon execution of the instructor module by a first processor and learner module by a second processor of the one or more processors, the learner module is configured to train a number of AI models in parallel on one or more concepts, and the instructor module is configured to coordinate with a number of simulators for respectively training the AI models on the one or more concepts. The number of learning agents respectively correspond to the number of AI models, are the learning agents are configured to process training requests from the instructor module on data from the simulators for training the AI models. In addition, the learner module is further configured to train the AI models on a first batch of like or similar data synchronously pooled in a memory of the learner module with a first CPU, GPU, or DSP of the one or more processors, as applicable. The learner module is configured to then train the AI models on additional sets of data, such as a second different, batch of like of similar data synchronously pooled in the memory of the learner module with the first CPU, GPU, or DSP of the one or more processors, as applicable. This process of using batching additional sets of similar data, such as a fourth and a fifth set of batched similar data, from multiple simulations occurring in parallel can be utilized to decrease the training time of an AI model and/or train multiple AI models in parallel.

In an embodiment, the AI engine further includes an asynchronous round-robin handler configured to schedule the training requests. The asynchronous round-robin handler is further configured to coordinate resource utilization of the first CPU, GPU, or DSP. The CPU, GPU, or DSP is configured to run a copy of each of the AI models for training the AI models in parallel on the one or more concepts with the simulators.

In an embodiment, the artificial intelligence engine is resident on one or more computer platforms that each include one or more CPUs, GPUs, DSPs, or a combination thereof. The modules of the AI-engine include an instructor module, a predictor module, and a learner module. The learner module, upon execution of the learner module by the one or more processors, is configured to train an AI model. The instructor module, upon execution of the instructor module by the one or more processors, is configured to coordinate with two or more simulations to train the AI model on one or more concepts on this same AI engine in parallel.

An instruction classifier/learning agent is configured to: i) group instructions from two or more simulations for training the AI model, ii) execute a first group of instructions set by the instruction classifier/learning agent on a first CPU, GPU, or DSP, as applicable, and iii) execute a second group of instructions set by the instruction classifier/learning agent on the first CPU, GPU, or DSP, as applicable. The grouping of instructions from two or more simulations for training the AI model improves a utilization of the instructor module and the first CPU, GPU, or DSP of the one or more processors, as applicable, than processing the training requests from a single simulation.

Any software implemented in the AI engine can be stored in one or more non-transitory machine-readable mediums in an executable format, which can be executed by the one or more processors.

These and other features of the design provided herein can be better understood with reference to the drawings, description, and claims, all of which form the disclosure of this patent application.

DRAWINGS

The drawings refer to an embodiment of the design provided herein in which:

FIG. 1A provides a block diagram illustrating an AI system in accordance with an embodiment.

Figure 1B:
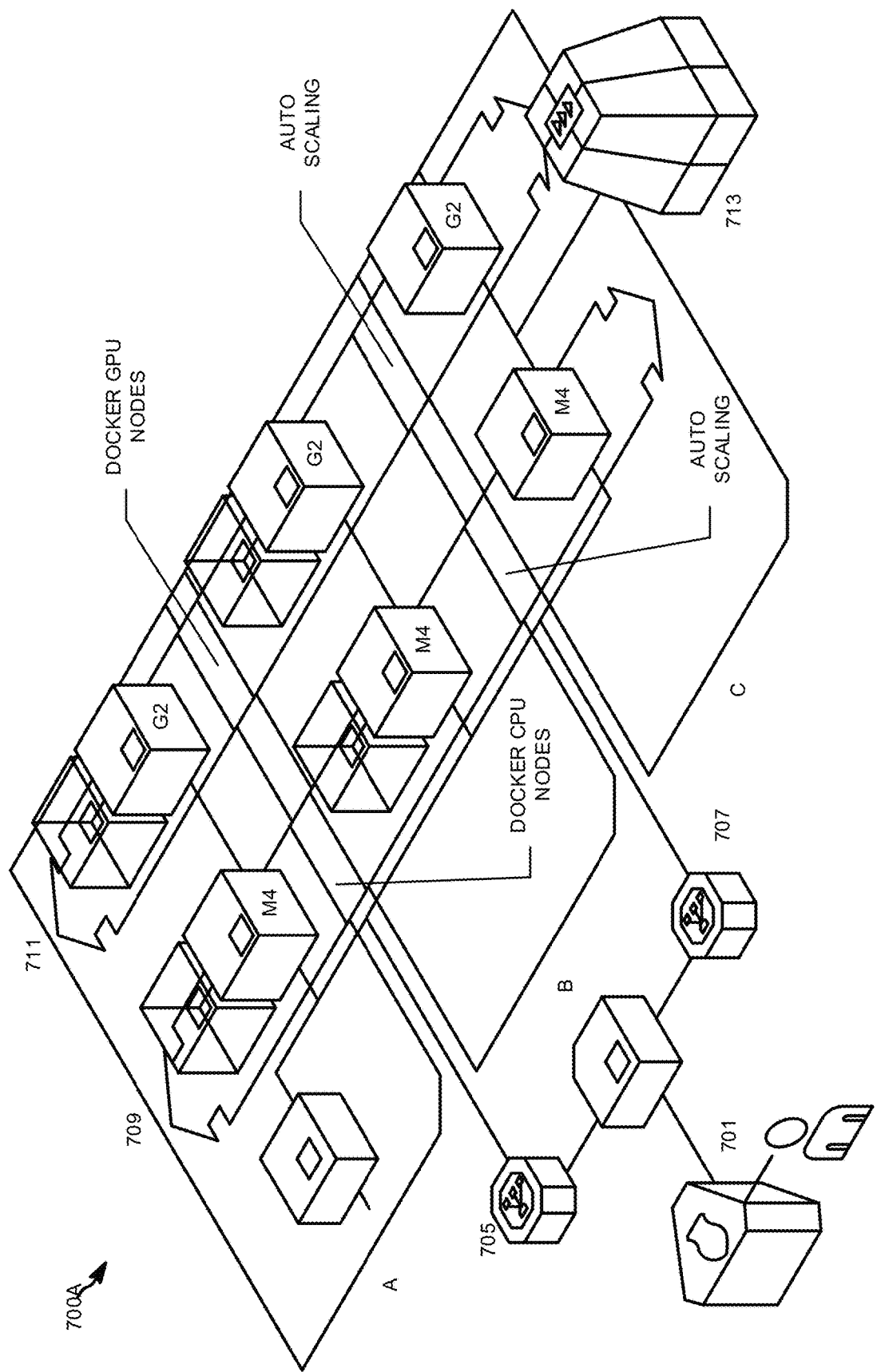

FIG. 1B provides a block diagram illustrating an AI system in accordance with an embodiment.

Figure 1C:
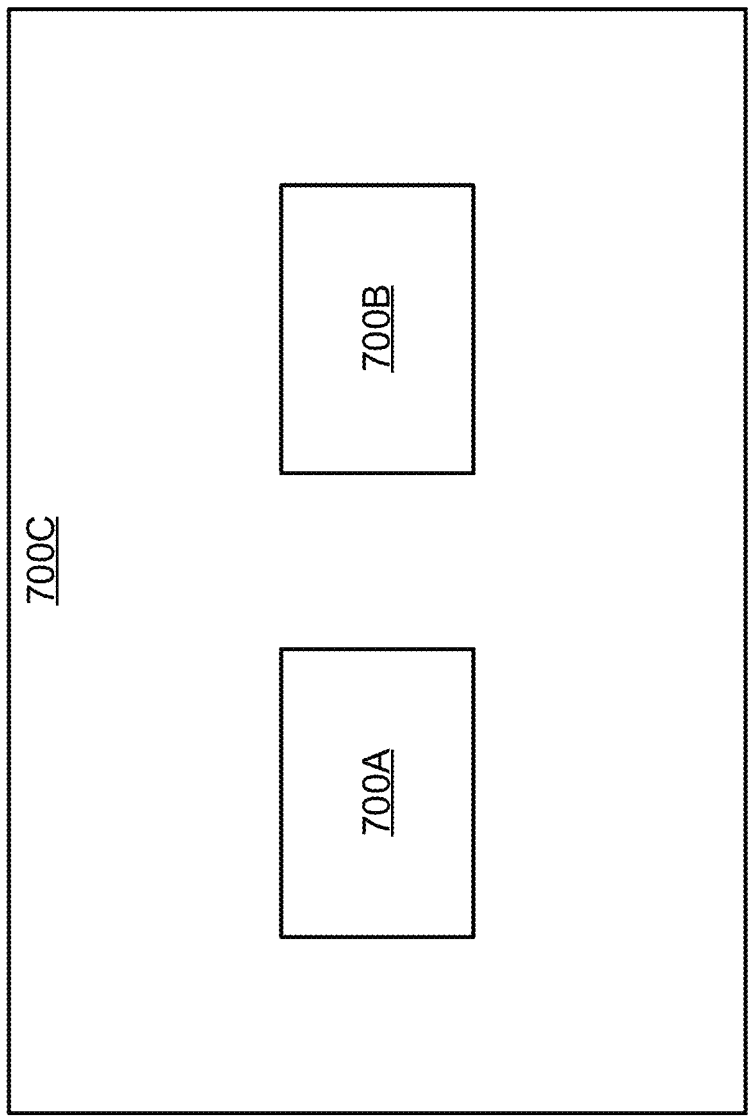

FIG. 1C provides a block diagram illustrating an AI system in accordance with an embodiment.

Figure 2:
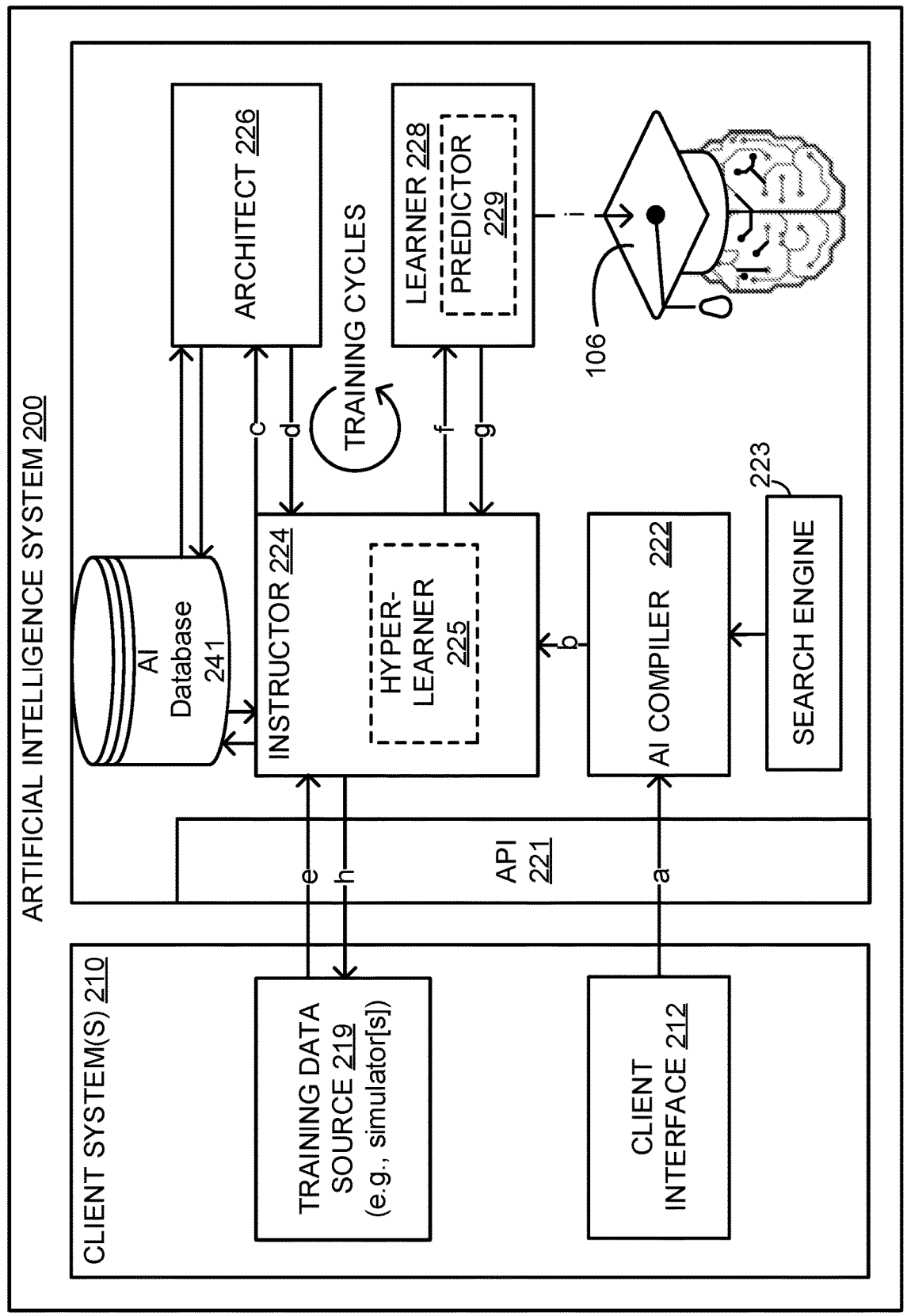

FIG. 2 provides a block diagram illustrating an AI system in accordance with an embodiment.

Figure 3:
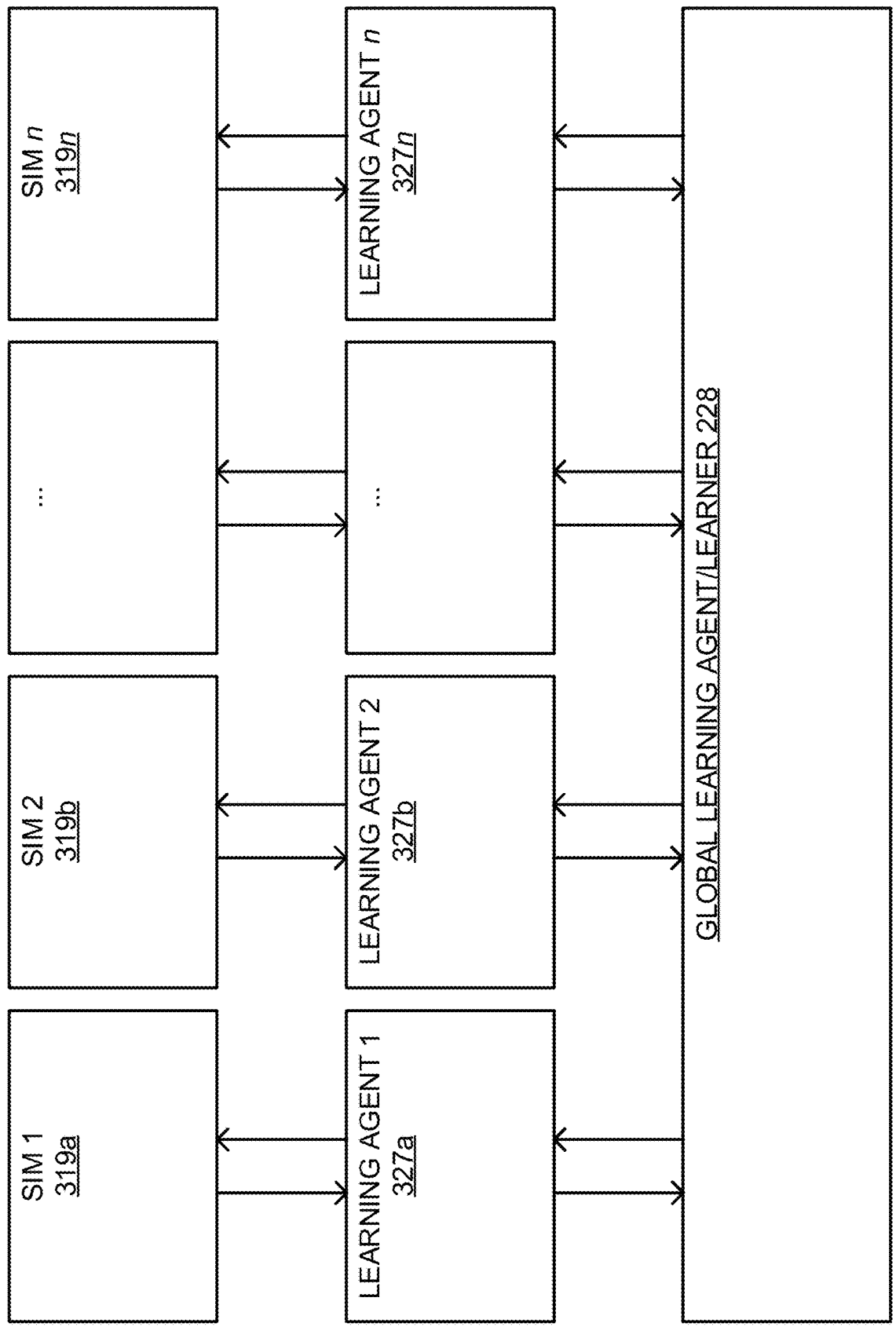

FIG. 3 provides a schematic illustrating a number of learning agents of an AI system for training a number of AI models with a number of simulators in parallel in accordance with an embodiment.

Figure 4:
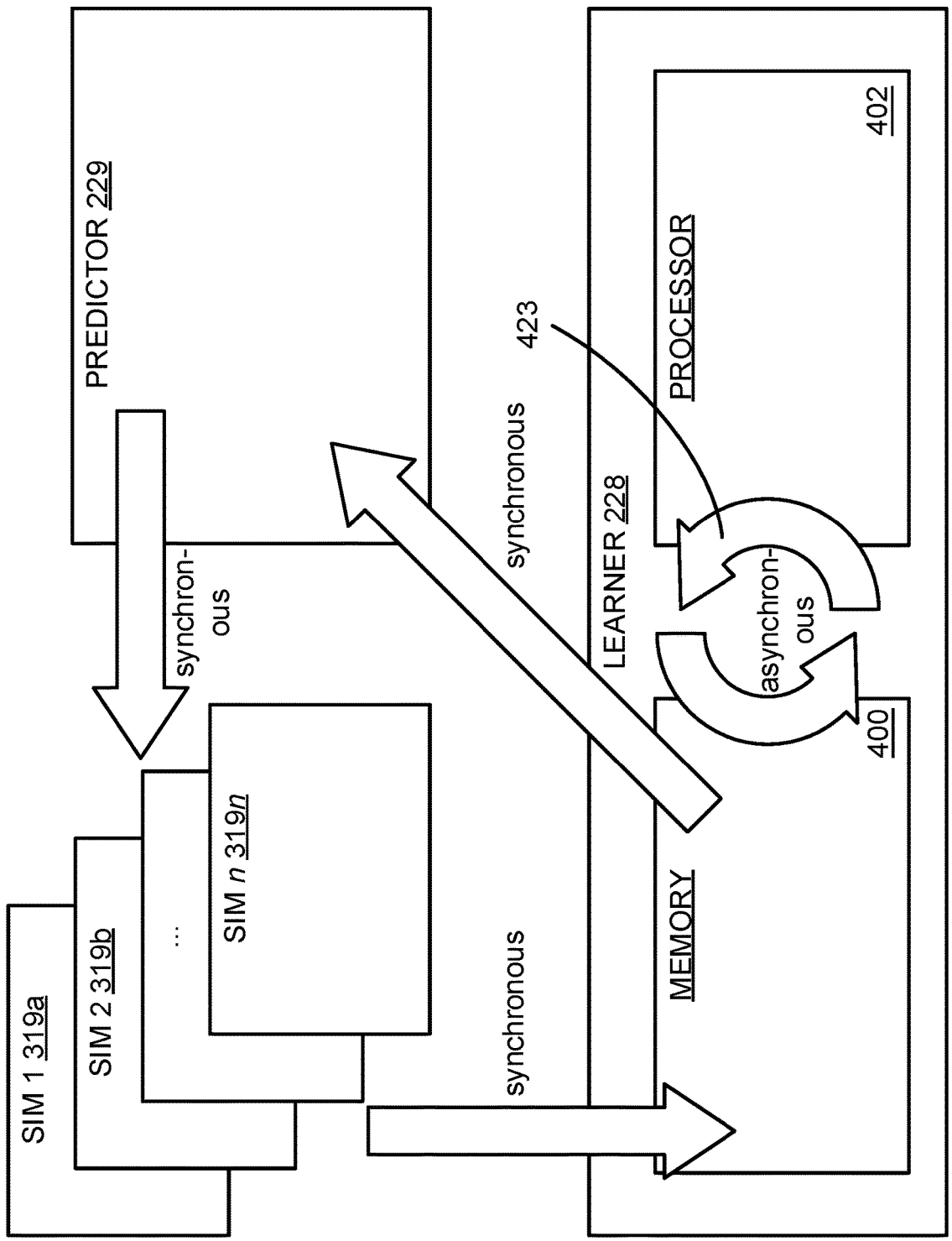

FIG. 4 provides a schematic illustrating data flow through a number of simulators, a learner module, and a predictor module of the AI system in accordance with an embodiment.

Figure 5A:
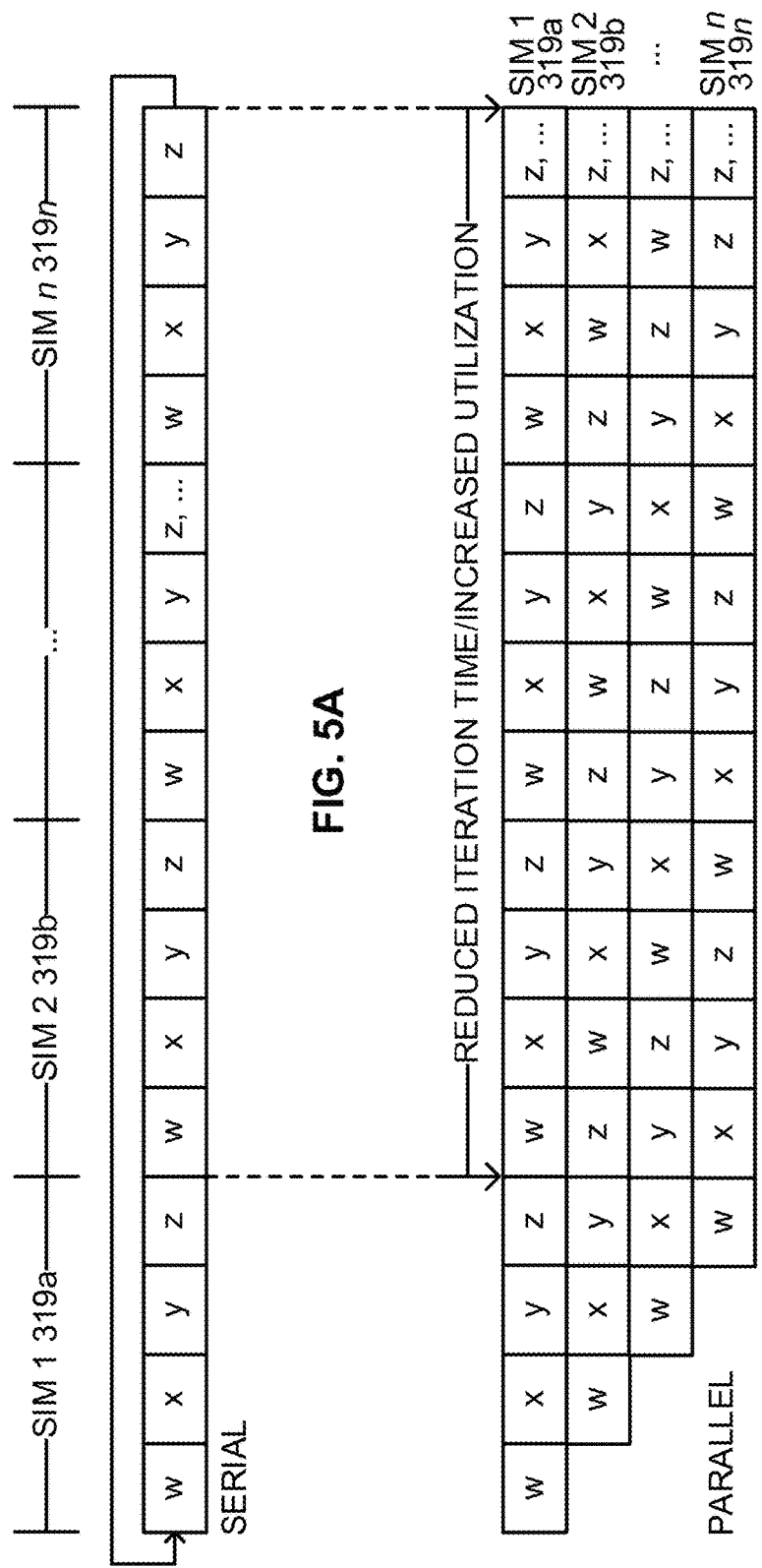
Figure 5B:
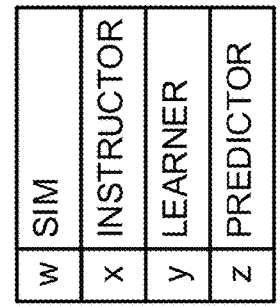

FIG. 5A and FIG. 5B provide schematics illustrating reduced iteration time for training a number of AI models with a number of simulators in parallel resulting in increased utilization of one or more processors in accordance with an embodiment.

Figure 6A:
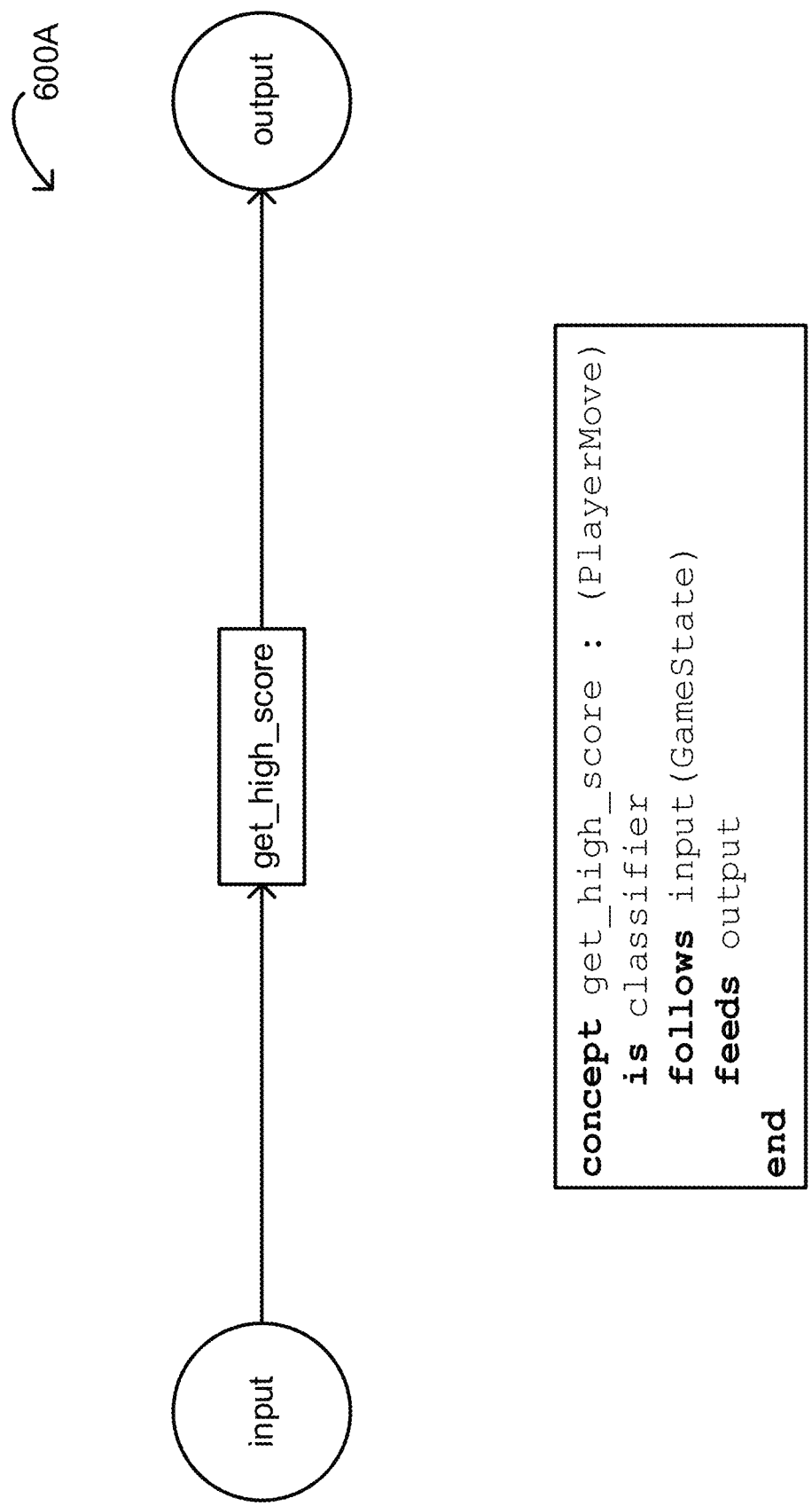

FIG. 6A provides a block diagram illustrating a mental model in accordance with an embodiment.

Figure 6B:
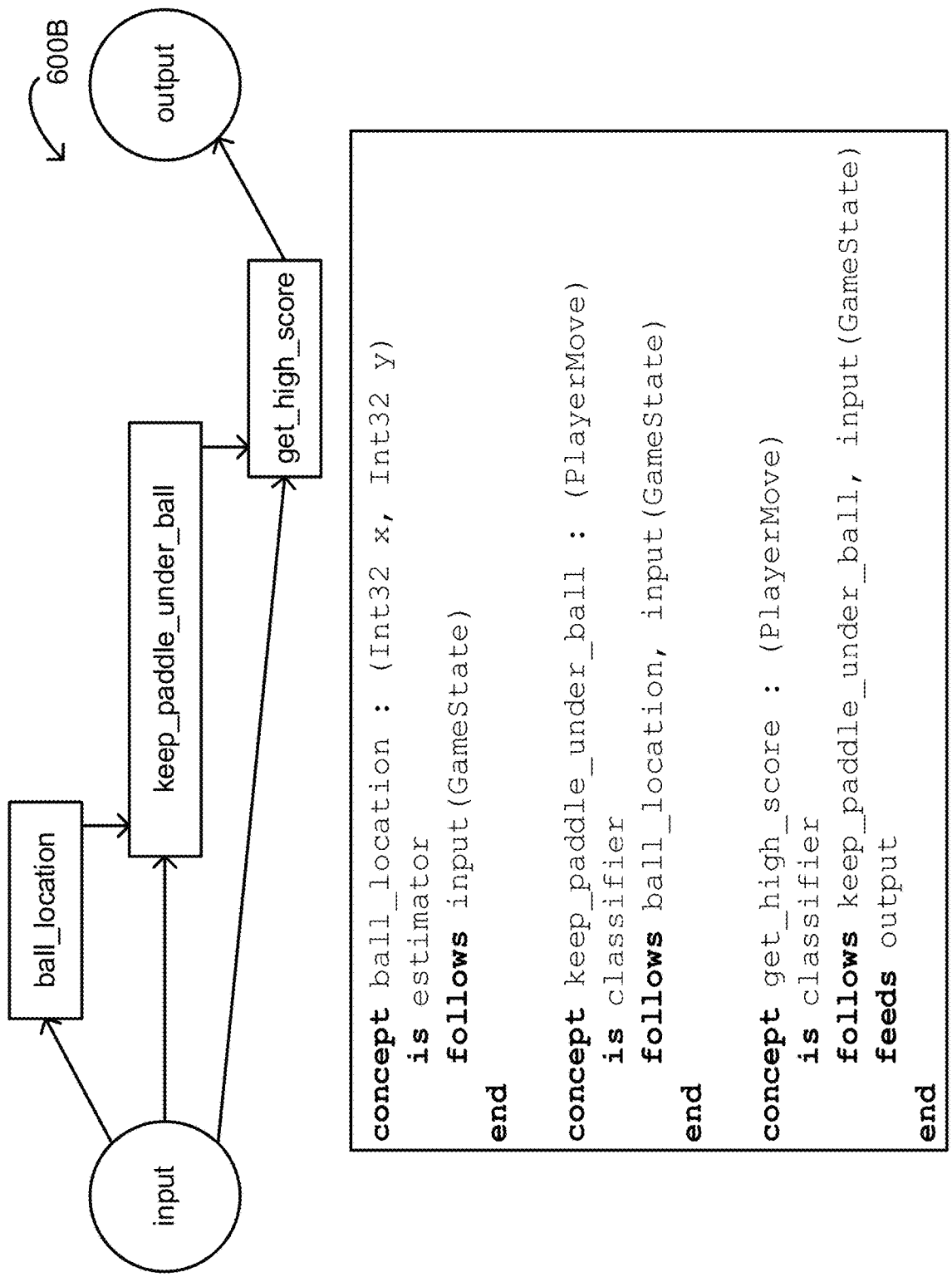

FIG. 6B provides a block diagram illustrating a mental model in accordance with an embodiment.

Figure 7:
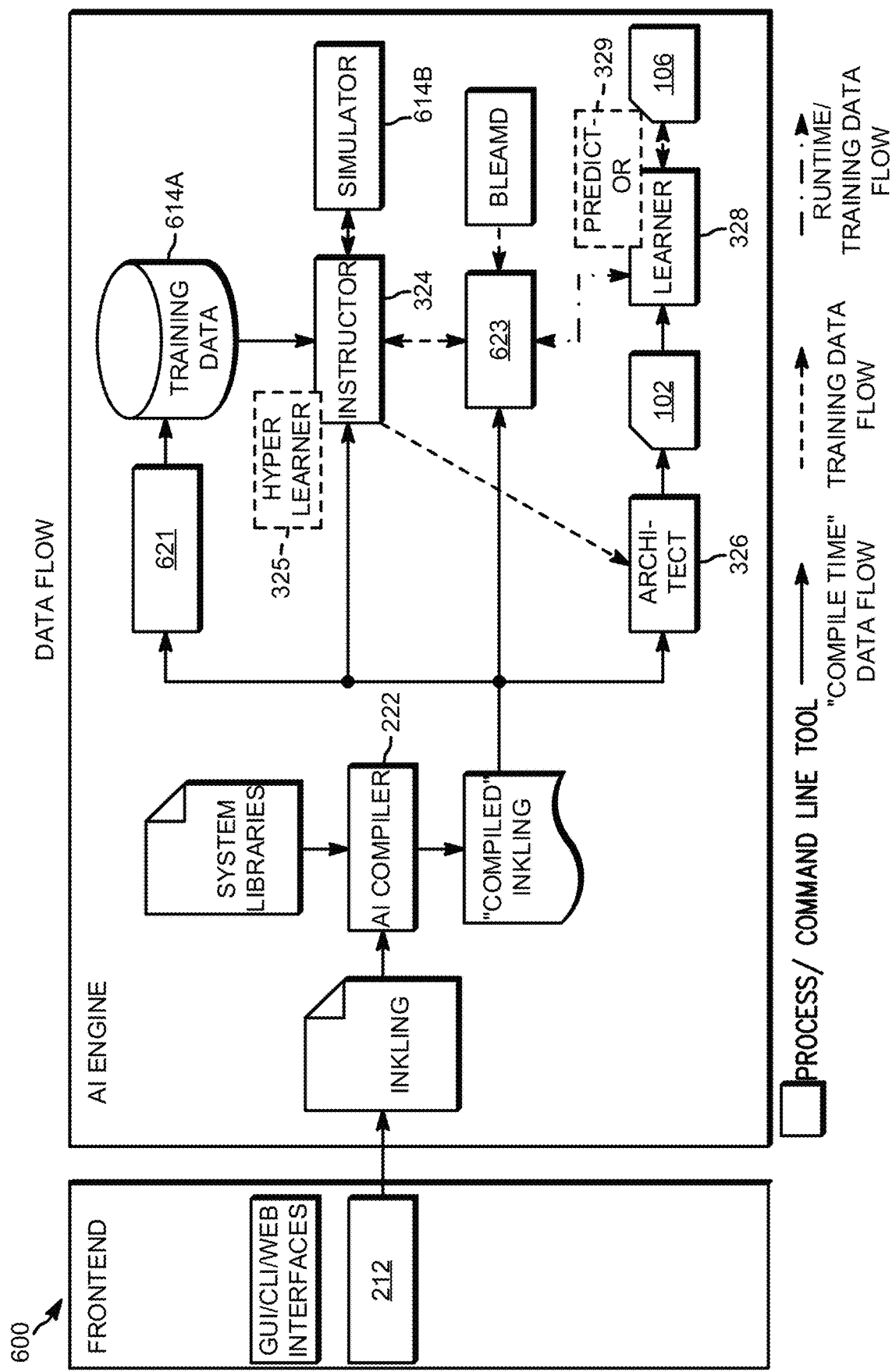

FIG. 7 provides a block diagram illustrating an AI system in accordance with an embodiment.

Figure 8A:
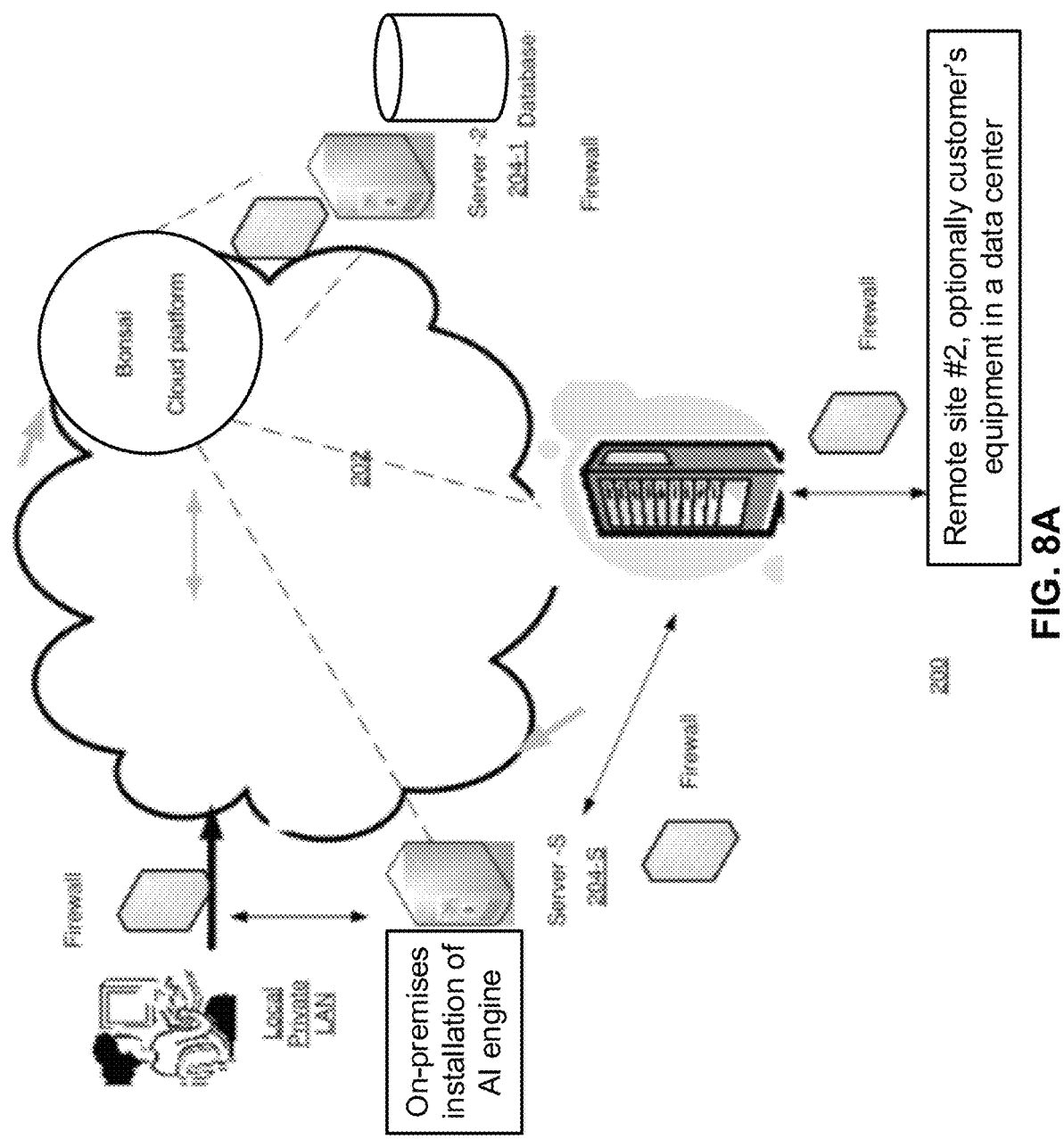

FIG. 8A provides a schematic illustrating one or more networks in accordance with an embodiment.

Figure 8B:
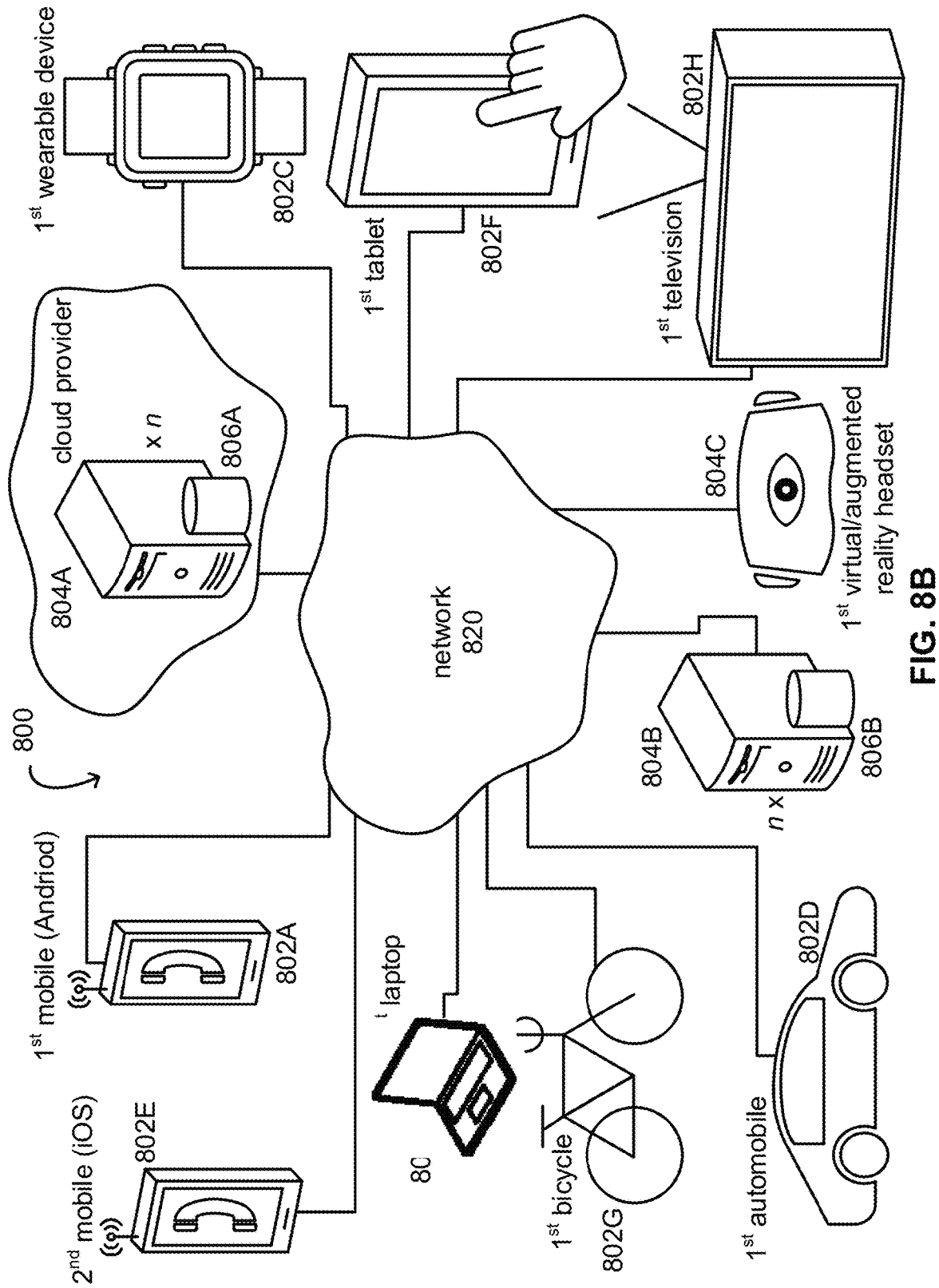

FIG. 8B provides a block diagram illustrating one or more networks in accordance with an embodiment.

Figure 9:
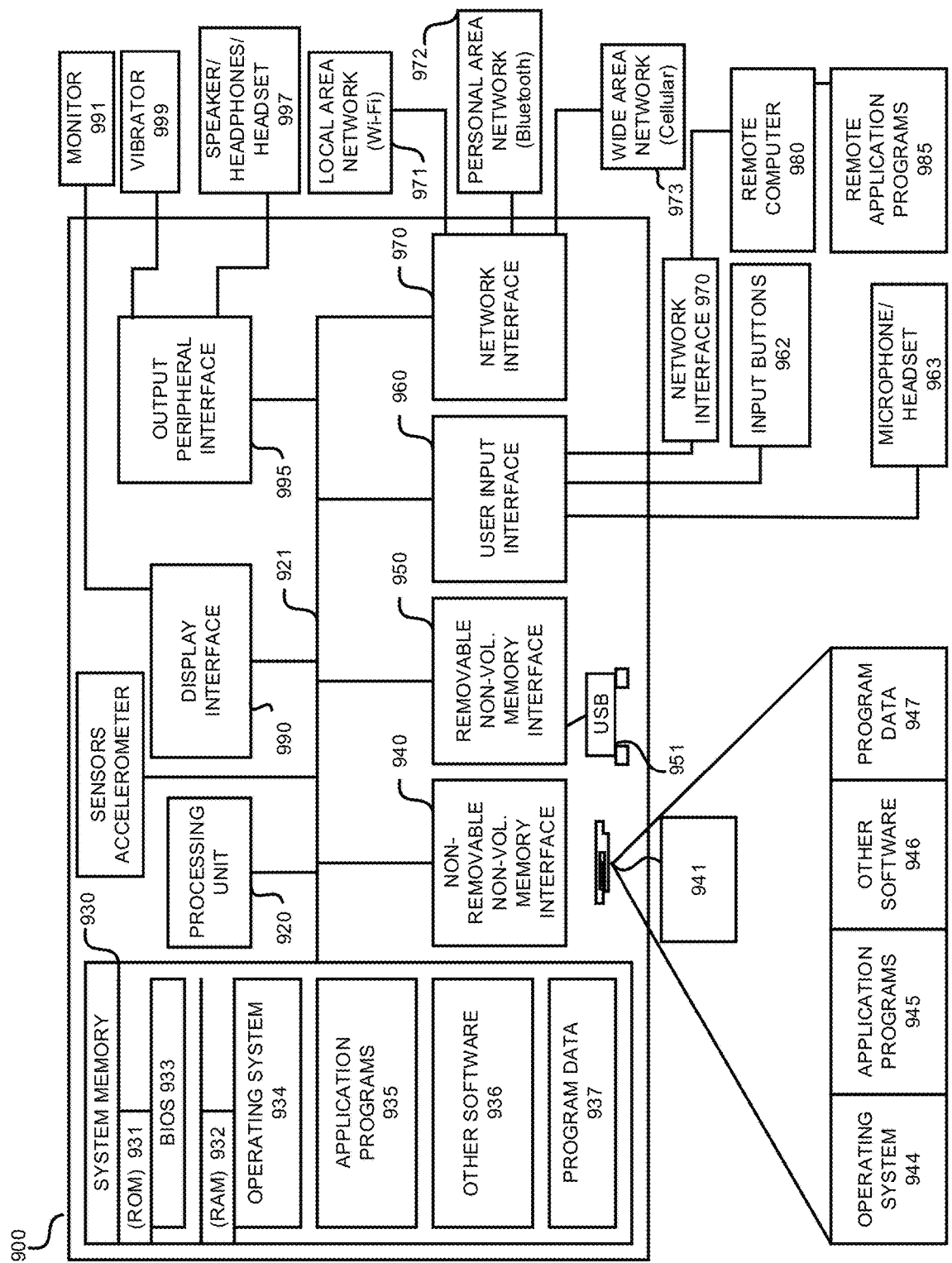

FIG. 9 provides a block diagram illustrating one or more computing systems in accordance with an embodiment.

Figure 10:
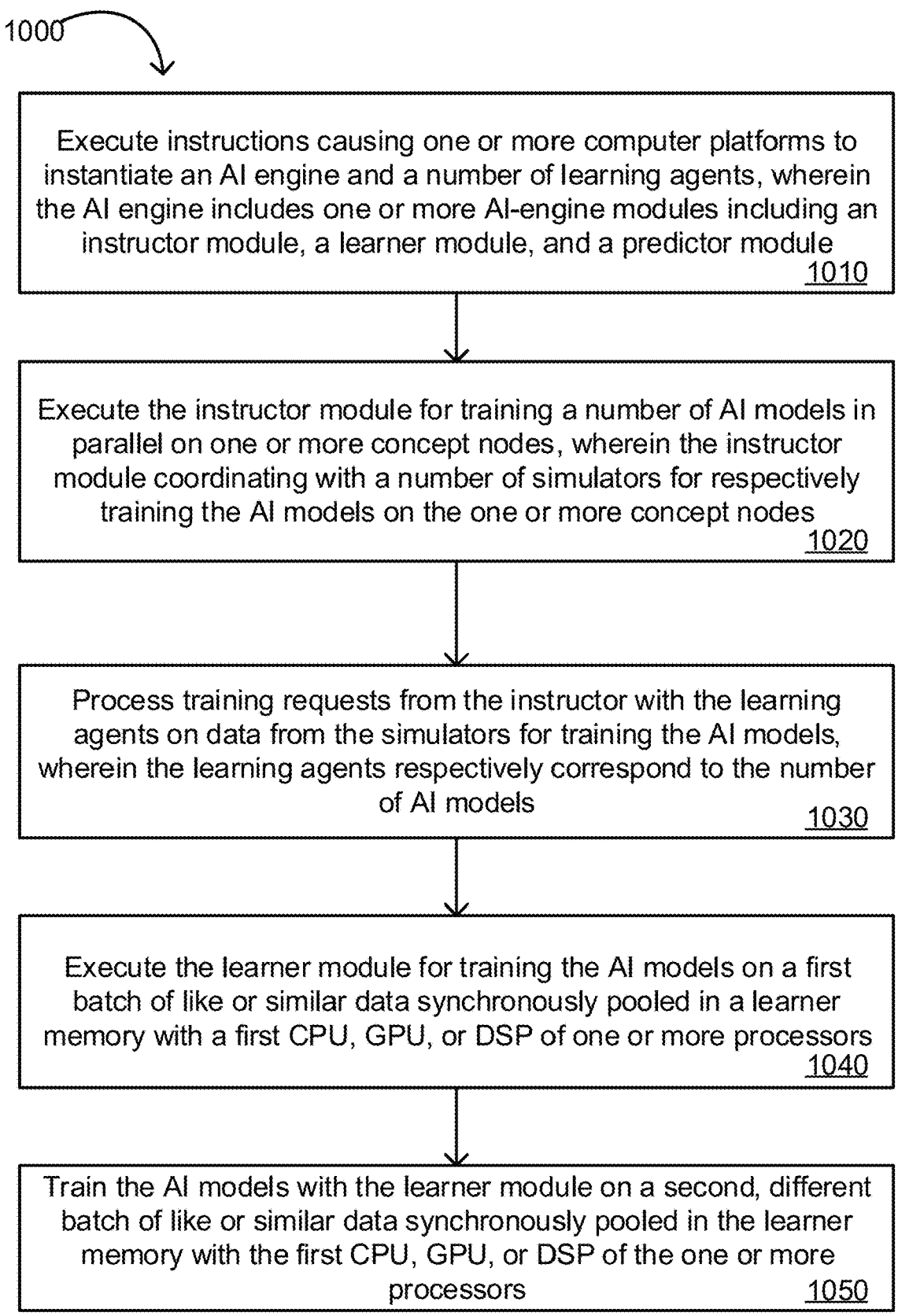

FIG. 10 provides a block diagram illustrating a method in accordance with an embodiment.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, memories in a device, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as a first database, can be made. However, the specific numeric reference should not be interpreted as a literal sequential order but rather interpreted that the first database is different than a second database. Thus, the specific details set forth are merely exemplary. Also, the features implemented in one embodiment may be implemented in another embodiment where logically possible. The specific details can be varied from and still be contemplated to be within the spirit and scope of the present design. The term coupled is defined as meaning connected either directly to the component or indirectly to the component through another component.

In general, an AI engine is discussed having multiple independent processes on one or more computer platforms including one or more processors such as CPUs, GPUs, or DSPs configured to run a copy of each of a number of AI models for training the AI models in parallel on one or more concepts with a number of simulators. The one or more computer platforms include an on-premises-based platform, a cloud-based platform, which can be a public, virtual private, or private cloud-based platform, or a hybrid-based platform of the on-premises-based platform and the cloud-based platform. In accordance with various embodiments, the CPUs, GPUs, or DSPs have an increased utilization in the one or more computer platforms due to reduced iteration times for training a number of AI models with a number of simulators in parallel. In an embodiment, the computer platform is an on-premises-based platform hosting the AI engine.

To enhance at least on-premises use of the AI training platform with simulations, CPU, GPU, and/or DSP performance enhancements may be made. Low-level training systems are built to support granular, asynchronous training processes that allow for multiple parallel data sources to feed data into the AI engine platform in a manner that minimizes dependencies and contention from within the system (allowing simultaneous training and dataflow tasks to occur).

By breaking down the tasks into smaller components, classifying those smaller components into groups of similar tasks, such as i) copying data in, ii) performing a computation on different types of data, iii) sending data out, iv) etc., this allows resources, such as portions of the CPU, GPU, and/or DSP memory, to perform the similar tasks in parallel across multiple simulations. The similar tasks from multiple simulations are pipelined/funneled into the portions of the GPU and memory set up for performing that task; and thus, perform that service for multiple simulations at the same time.

The one or more computing platforms can be located on premises of an organization including, but not limited to corporations, governments, non-governmental organizations, political organizations, international organizations, armed forces, charities, not-for-profit corporations, partnerships, cooperatives, educational institutions, volunteer associations, and hybrid organization including any combinations of the foregoing. Being on premises of the organization, i) the one or more computing platforms are configurable for one or more users in the organization with at least administrative rights over the one or more computing platforms; ii) the one or more users of the organization are able to physically access the one or more computing platforms; and iii) the hardware components of the one or more computing platforms are connected to each other through a Local Area Network ("LAN"). The LAN is configurable such that the one or more users in the organization have a right to control an operation of the LAN.

FIGS. 1A through 9 illustrate one or more example systems and infrastructure to implement one or more of the above concepts.

Backend Infrastructure

FIG. 1A provides a block diagram illustrating an AI system 700B in accordance with an embodiment. The AI system 700B includes at least one or more CPU computing devices such as a first CPU computing device 709A, which can be part of an on-premises-based installation, a cloud-based installation, or a hybrid-based installation of the AI system 700B. The AI system 700B can further include a second CPU computing device 709B, as well as one or more GPU computing devices such as a first GPU computing device 711A. Each of the computing devices can be located together on a same, single-enclosure machine or separated in some combination on different machines of a cluster of machines communicatively coupled by way of, for example, a private subnet, wherein a cluster manager and scheduler such as Nomad is configured to manage the cluster. The first CPU computing device 709A can be utilized by a compiler and an architect module/process that are part of an AI-model service. (See FIG. 2) The second CPU computing device 709B can be utilized by an instructor module. (See FIG. 2) The GPU computing device 711B can be utilized by the learner module/process and the predictor module/process. In an embodiment, the AI system 700B is implemented solely as an on-premises-based installation.

Each of the independent process can be running on a dedicated computing device 709A-711A and use a subnet to communicate communications between the other independent processes. If desired, or if short on hardware resources, some independent processes may share a computing device. Also, using a subnet can be more secure than, for example, trying to conduct communications through the Internet by way of a gateway, which would possibly expose the communications.

Individual processes programmed to achieve and perform different functions within the AI engine are broken up into an individual process, each in its own software container. For example: 1) The architect process can be configured to create, instantiate, and figure out the topology of an AI model corresponding to a concept being trained for artificial intelligence; 2) an instructor process can be configured to guide the training and how to do the training; 3) a learner process can be configured to carry out an actual execution of the training; and 4) a predictor process can be configured to make use of a trained AI model during a deployment of the AI model. Breaking these up into individual processes/modules that are aware of each other, know the process or service to call, know how to call that process, and also know the inputs and outputs to send to each other, allows the training to be broken up into these multiple discrete individual services.

Each of these processes can be configured as an independent process wrapped in its own container so that multiple instances of the same processes, for example, learner and instructor, may be running simultaneously to scale to handle multiple users running training sessions for AI models, deploying AI modules, and creating AI models, all at the same time. Thus, a backend platform for the AI engine exists with servers, processes, and databases, that allows many users to connect from multiple machines of the cluster of machines. The backend of the platform is configured to handle the scaling, efficiency, and the like by dynamically calling for additional computing hardware machines to load on and run the independent processes of, for example, an instance of the learner and/or instance of the instructor. This can also be set up for an on-premises installation of the AI engine.

The multiple independent processes carry out four or more separate tasks by interaction with and cooperation between the multiple independent processes. A first task can be creating a shell of an AI model, such as creating an AI model. A second task can be loading in a file of scripted code in a programming language to help define 1) a topology of processing nodes in the AI model, 2) a layout of the concepts making up the AI model, and 3) a selection of an appropriate learning algorithm for the AI model. The file, created in a pedagogical software programming language such as Inkling™, helps the architect module to create the topology of processing nodes in the AI model, the layout of the concepts making up the AI model, etc. derived from the programming code. The third task is starting to train the AI model with a data source, such as a simulator. The fourth task is then deploying and using a trained AI model to do, for example, predictions on data from the data source.

Each independent process, such as 1) the instructor module, 2) the learner module, and 3) the architect module as part of an AI engine can be configured to operate on a CPU computing device, a GPU computing device, or both.

Note, functionality performed by one software process may be combined into another software process or migrated in part to another software process. For example, in an embodiment, the 'instructor' and 'learner' processes are merged into a single, combined process running within a single container named the 'scholar.' Thus, the 'instructor' and 'learner' may be implemented as independent processes. Each independent processes running in its own container. However, for performance reasons these 'instructor' and 'learner' processes may be merged into a single, combined process running within a single container named the 'scholar'. The functionality in the 'instructor' and 'learner' is still present as before, just not in independent processes.

The processes of the AI engine installed on on-premises servers can generate AI models. The processes of the AI engine installed on on-premises servers can deploy AI models for prediction. The processes of the AI engine installed on on-premises servers can train AI models.

FIG. 1B provides a block diagram illustrating an AI system 700A in accordance with an embodiment. A backend cloud platform can exist of various servers, processes, databases, and other components that connect over a network, such as the Internet, to a number of computing devices. The backend cloud platform is configured to handle the scaling, efficiency, and the like. Such a cloud platform can be a public cloud, VPC, or a private cloud.

In an embodiment, a user such as a software developer can interface with the AI system 700A through an online interface 701; however, the user is not limited to the online interface, and the online interface is not limited to that shown in FIG. 1B. An input may be supplied from an online API, a command line interface, or a graphical user interface such as an Integrated Development Environment ("IDE") such as Mastermind™. With this in mind, the AI system 700A of FIG. 1B can enable a user to make API and web requests through a domain name system ("DNS") 701, which requests can be optionally filtered through a proxy to route the API requests to an API load balancer 705 and the web requests to a web load balancer 707. Alternatively, the proxy service may be part of a service running on a CPU computing device. The API load balancer 705 can be configured to distribute the API requests among multiple processes wrapped in their own containers running in a containerization platform, such as a Docker type network. The web load balancer 707 can be configured to distribute the web requests among the multiple processes wrapped in their own containers running in this containerization platform. The network can include a cluster of one or more central processing unit ("CPU") computing devices 709 and a cluster of one or more graphics processing unit ("GPU") computing devices 711. One or more service running in the network will scale more or less CPU computing devices 709 and GPU computing devices 711 as needed. The CPU computing devices 709 can be utilized for most independent processes running on the swarm network, and the GPU computing devices 711 can be utilized for the more computationally intensive independent processes such as TensorFlow and the learner process. Various services may run on either the CPU computing device 709 or in the GPU computing device 711, as capacity in that machine is available at the time.

As further shown in FIG. 1B, a logging stack, such as an Elasticsearch-Logstash-Kibana ("ELK") stack cluster, 713 can be shared among all production clusters for dedicated monitoring and an indexing/logging.

The cloud-based platform 700A with multiple independent processes is configured for the user to define the AI problem to be solved. In an embodiment, all of the individual processes are wrapped into a container program such as a Docker. The software container allows each instance of that independent process to run independently on whatever computing device that instance is running on.

A software process may be an instance of an executable file configured to perform a task in a finite amount of time (e.g., a job). Thus, each process is configured to operate for a finite amount of time to achieve its configured goal and then shut down until invoked again when needed in the future. Several instances of a same process each wrapped in its own container may run simultaneously on one or more computing devices. A service may be a process, which runs in the background. Each independent process is configured to be aware of the existence of the other processes and knows whom to call and what data and types of inputs that other processes looking for.

The individual processes in the AI engine utilize a scaling hardware platform, such as Amazon Web Services ("AWS") for an on-line installation (and similar set up for an on premises installation), so that the individual processes of the AI engine, the amount of Central Processing Units ("CPUs"), Graphics Processing Units ("GPUs"), and RAM may dynamically change overtime and rapidly change to scale to handle multiple users sending multiple AI models to be trained.

For example, an engineer service can be configured to dynamically change an amount of computing devices 709, 711 over time running independent processes and to rapidly change the amount to scale to handle multiple users sending multiple AI models to be trained. A conductor service or an engineer service can cause a first instance of an instructor process to be instantiated, loaded onto a CPU computing device, and then run on a first CPU computing device 709.

The AI engine having multiple independent processes on the cloud-based platform 700A, where the multiple independent processes are configured as an independent process wrapped in its own container so that multiple instances of the same processes (e.g., learner process and instructor process), can run simultaneously to scale to handle one or more users to perform actions. The actions are selected from a group consisting of 1) running multiple training sessions on two or more AI models at the same time, in parallel, 2) creating two or more AI models at the same time, 3) running a training session on one or more AI models while creating one or more AI models at the same time, 4) deploying and using two or more trained AI models to do predictions on data from one or more data sources, and 5) any combination of the foregoing on the same AI engine. CPU bound services can include, for example, a document database for storing AI objects such as an AI database, a Relational Database Server such as PostgreSQL, a time-series database such as InfluxDB database, an AI-model service including an architect module and AI compiler, an AI-model web service, a conductor service, a watchman service, a CPU Engineer service, an instructor process, a predictor service, and other similar processes. GPU Bound services can include, for example, a GPU Engineer service, a learner process, and other computationally heavy services. For example, a first CPU computing device may load and run an architect module. A second CPU computing device may load and run, for example, an instructor process. A first GPU computing device may load and run, for example, a learner process. A first service such as an engineer service, may then change an amount of computing devices running independent processes by dynamically calling in a third CPU computing device to load and run, for example, a second instance of the instructor process, and calling in a second GPU computing device to load and run, for example, a second instance of the learner process.

Scaling in this system requires dynamically changing both 1) an amount of independent processes running and 2) an amount of computing devices configured to run those independent processes, where the independent processes are configured to cooperate with each other. The dynamically changing of an amount of computing devices, for example, more GPUs or CPUs in order to run additional instances of the independent processes allows multiple users to utilize the cloud-based system at the same time and to, for example, 1) conduct multiple training sessions for AI models in parallel, 2) deploy AI models for use, and 3) create new AI models, all at the same time. Clusters of hardware of CPU devices and GPU devices can be dynamically scaled in and out on, for example, an hourly basis based on percent load capacity used and an amount of RAM memory left compared to a current or expected need.

FIG. 1C provides a block diagram illustrating an AI system 700C in accordance with an embodiment. In such embodiments, the AI system 700C is a hybrid configuration or hybrid platform between one or more computing platforms located on premises as shown in FIG. 1A and one or more cloud-based computing platform connected over the Internet as shown in FIG. 1B. Such a hybrid platform provides data security for training with training data as well as scaling, which can be easier in the cloud-based platform because scaling requires dynamically changing both 1) an amount of independent processes running and 2) an amount of computing devices configured to run those independent processes. FIG. 8A provides a schematic illustrating how such a hybrid configuration or hybrid platform is networked in an embodiment.

In view of the foregoing, the AI engine having multiple independent processes on one or more computing platforms includes an on-premises installation such as that of FIG. 1A, optionally in combination with a cloud-based platform such as that of FIG. 1B, which provides the hybrid configuration or hybrid platform of FIG. 1C. The multiple independent processes are configured to have their instructions executed by one or more processors (see CPU and GPU dockers of FIG. 1A, FIG. 1B, or both FIGS. 1A and 1B) in the one or more computing platforms.

The multiple independent processes are configured as a set of independent processes, each independent process thereof wrapped in its own software container. This includes at least an instructor process 224 and a learner process 228 as described in reference to FIG. 2. The instructor process is configured to carry out a training plan codified in a pedagogical software programming language. The learner process is configured to carry out an actual execution of underlying AI learning algorithms during a training session. The instructor process and the learner process of the set of independent processes cooperate with one or more data sources to train a new AI model.

Each independent process is wrapped in its own software container so that multiple instances of a same independent process can run simultaneously to scale to handle a number of actions. One such action is running multiple training sessions on two or more AI models at a same time in parallel. Another such action is creating the two or more AI models at a same time. Another such action is running a training session on one or more of AI models while creating the one or more AI models at the same time. Another is training one AI model with multiple simulations running in parallel to speed up the training time of that AI model.

A first instance of the multiple independent processes is configured to scale to handle the number of actions by dynamically calling in additional computing devices to load on and run additional instances of each independent process wrapped in its own container as needed. The first instance is therefore configured to dynamically change an amount of computing devices over time running the multiple independent processes to rapidly scale and handle multiple users sending multiple AI models to be trained. Each instance of the multiple independent processes is similarly configured to run independently on whatever computing device that instance is running on. The first instance is configured to cause, for example, a second instance of, for example, an instructor process to be instantiated, loaded onto a CPU computing device, and then run on the CPU of the computing device.

The multiple independent processes improve an efficiency of the one or more computing platforms hosting the AI engine by scaling over an amount of available computing platforms. Note, the processing of training requests from the instructor module on data from a plurality of simulators for training the AI models improves a utilization of the instructor module and the CPU, GPU, or DSP of the one or more processors, as applicable, than processing the training requests from a single simulator. Likewise, grouping of instructions from two or more simulations for training an AI model improves a utilization of the instructor module and the CPU, GPU, or DSP of the one or more processors, as applicable, than processing the training requests from a single simulation.

With respect to the one or more computing platforms located on premises of a user's organization such as in FIG. 1A, one or more users in the user's organization has at least administrative rights over the one or more computing platforms such as through a common user interface for the one or more users on the one or more computing platforms. This enables the user's organization to configure hardware components of the one or more computing platforms to operate how the user's organization chooses to fit their needs to execute and load the multiple independent processes. In addition, the one or more users of the user's organization are able to physically access the one or more computing platforms when needed.

As shown in at least FIGS. 1A and 8A, the hardware components of the one or more computing platforms are connected to each other through a Local Area Network (LAN). The LAN is configurable such that the one or more users in the user's organization have a right to control an operation of the LAN. All of the multiple independent processes configured to load and execute on the one or more computing platforms, which platforms are all connected by the LAN.

Processor Architecture Enhancements can be Made to Increase Throughput on Training AI Models with the Available Processing Components, Such as Graphics Processing Units (GPUS), Central Processing Units (CPUs), and/or a Digital Signal Processors (DSPs)

In all of the installations, the low-level learning infrastructure has some changes to increase the throughput of its training algorithms. In particular, these improvements focused on exploiting available computing power within on-premises installations of the AI engine platform with powerful single-enclosure machines. In this environment, the performance of the learning systems are significantly hindered by the ability to get trainable data down into the actual computing components (CPU/GPU). Note, these improvements can be implemented in all of the installations, i) on-premises installations of the modules making up the AI engine, ii) on-line cloud usage of the AI engine, and iii) hybrid installations where portions of the AI engine exist on both of the machines on-premises as well as the machines in the cloud.

To increase the throughput of the training algorithms of the AI engine, the low-level training systems have been built to support more granular, asynchronous training processes that allows for multiple parallel data sources to feed data into the modules making up the AI engine in a manner that minimizes dependencies and contention from within the system (allowing simultaneous training and dataflow tasks to occur).

By breaking down the tasks into smaller components, and allowing resources, the processors and the modules of the AI engine, to perform the tasks in parallel, the system is able to increase the amount of training data available to the learning algorithms by several multiples (depending on the number of parallel data sources).

Now, simulator data is fed into the instruction and learning processes (via the instructor module and learner module) through multiple execution pipe lines, and data is processed in parallel. Thus, multiple simulator sources are sampled in parallel, and data transfers to computational units (CPU/GPU/DSP) are executed in parallel threads. Training is also executed in parallel on the previously-sent data and continuously train as data is made available.

FIG. 2 provides a block diagram illustrating an AI system in accordance with an embodiment.

Brief Discussion of Components in the AI Engine

The AI engine for generating a trained AI model 106 can include one or more AI-generator modules selected from at least an instructor module 224, an architect module 226, and a learner module 228 as shown. The instructor module can be configured to update training parameters for each of a number of AI models; execute a training curriculum for each of the AI models; track a training progress for each of the AI models; start and stop the training for each of the AI models; and control any simulators. With respect to controlling the simulators, the simulators pause after sampling until predictions are sent for each of the AI models during the training. The instructor module 224 can optionally include a hyper-learner module 225, which can be configured to select one or more hyper parameters for any one or more of a neural network configuration, a learning algorithm, and the like. The hyperlearner module 225 can optionally be contained in a different AI-generator module such as the architect module 226 or the learner module 228, or the hyperlearner module 225 can be an AI-generator module itself. The learner module 228 can optionally include a predictor module 229, which can provide one or more predictions for a trained AI model or an AI model being trained. The predictor module 229 can optionally be contained in a different AI-generator module such as the instructor module 224 or the architect module 226, or the predictor module 229 can be an AI-generator module itself. The AI engine including the foregoing one or more AI-generator modules can be configured to generate the trained AI model, such as trained AI model 106, from compiled scripted software code written in a pedagogical software programming language via one or more training cycles with the AI engine.

Note, each trained AI model itself can be a collection of trained AI objects corresponding to a main concept and a set of sub concepts feeding parameters into the main concept. The AI database can index AI objects corresponding to the main concept and the set of sub concepts making up a given trained AI model so that reuse, recomposition, and reconfiguration of all or part of a trained AI model is possible.

One or more clients 210 can make a submission to create a trained AI model. Once a Mental Model (see FIGS. 6A and 6B) and Curricula have been coded in the pedagogical software programming language, then the code can be compiled and sent to the three main modules, the learner module 228, the instructor module 224, and the architect module 226 of the AI engine for training. One or more user interfaces 212, such a web interface, a graphical user interface, and/or command line interface, will handle assembling the scripted code written in the pedagogical software programming language, as well as other ancillary steps like registering the line segments with the AI engine, together with a single command. However, each module—the AI compiler module 222, the web enabled interface 221 to the AI engine, the learner module 228, etc.—can be used in a standalone manner, so if the author prefers to manually invoke the AI compiler module, manually perform the API call to upload the compiled pedagogical software programming language to the modules of the AI engine, etc., they have the flexibility and freedom to do so.

Thus, one or more clients 210 can send scripted code from the coder 212 or another user interface to the AI compiler 222. The AI compiler 222 compiles the scripted software code written in a pedagogical software programming language. The AI compiler 222 can receive input from a search engine 223. The AI compiler 222 can send the compiled scripted code, similar to an assembly code, to the instructor module 224, which, in turn, can send the code to the architect module 226. Alternatively, the AI compiler 222 can send the compiled scripted code in parallel to all of the modules needing to perform an action on the compiled scripted code. The architect module 226 can propose a vast array of machine learning algorithms, such as various neural network layouts, as well as optimize the topology of a network of intelligent processing nodes making up an AI object. The architect module 226 can map between concepts and layers of the network of nodes and send one or more instantiated AI objects to the learner module 228. Once the architect module 226 creates the topological graph of concept nodes, hierarchy of sub concepts feeding parameters into that main concept (if a hierarchy exists in this layout), and learning algorithm for each of the main concept and sub concepts, then training by the learner module 228 and instructor module 224 may begin.

The instructor module 224 can request training data from the training data source 219 such as one or more simulators. Training can be initiated with an explicit start command in the pedagogical software programming language from the user to begin training. In order for training to proceed, the user needs to have already submitted compiled pedagogical software programming language code and registered all of their external data sources such as simulators (if any are to be used) via the user interfaces with the learner and instructor modules 224, 226 of the AI engine.

The training data source 219 can send the training data to the instructor module 224 upon the request. The instructor module 224 can subsequently instruct the learner module 228 on training the AI object with pedagogical software programming language based curricula for training the concepts into the AI objects. Training an AI model can take place in one or more training cycles to yield a trained state of the AI model 106. The instructor module 224 can decide what pedagogical software programming language based concepts and streams should be actively trained in a mental model. The instructor module 224 can know what are the terminating conditions for training the concepts based on user criteria and/or known best practices. The learner module 228 or the predictor 229 can elicit a prediction from the trained AI model 106 and send the prediction to the instructor module 224. The instructor module 224, in turn, can send the prediction to the training data source 219 for updated training data based upon the prediction and, optionally, instruct the learner module 228 in additional training cycles. When the one or more training cycles are complete, the learner module 228 can save the trained state of the network of processing nodes in the trained AI model 106. (Note, a more detailed discussion of different embodiments of the components making up the AI engine occurs later.)

FIG. 3 provides a schematic illustrating a number of learning agents 327a, 327b, . . . , 327n of an AI system for training a number of AI models with a number of simulators 319a, 319b, . . . , 319n in parallel in accordance with an embodiment.

The AI engine or system 700A, 700B, or 700C resident on the one or more computer platforms including the one or more AI-engine modules such as the instructor module 224, the learner module 228, and the predictor module 229 can further include the number of learning agents 327a, 327b, . . . , 327n for training the corresponding number of AI models with the corresponding number of simulators 319a, 319b, . . . , 319n in parallel for an increased utilization of one or more processors such as CPUs, GPUs, DSPs, or a combination thereof on the one or more computer platforms.

Upon execution of the instructor module 224 and the learner module 228 by a processor of the one or more processors, the instructor module 224 is configured to cooperate with the simulators 319a, 319b, . . . , 319n and the corresponding learning agents 327a, 327b, . . . , 327n to provide simulator-specific streams of data to the learner module 228 to train the AI models in parallel on one or more concepts. The simulators 319a, 319b, . . . , 319n that train the AI models on the one or more concepts can be a mixture of like simulators randomized at different points in time (e.g., temporally decorrelated), which enables the AI engine to provide an optimized training of the AI models. The learning agents 327a, 327b, . . . , 327n are configured to track dependencies of such temporally decorrelated data from the simulators 319a, 319b, . . . , 319n for training the AI models, wherein tracking the dependencies of the data from the simulators enables streams of the data from the simulators 319a, 319b, ..., 319n to be separated into the simulator-specific streams. In addition, each of the learning agents 327a, 327b, ..., 327n is further configured to track previous and current simulator states of its corresponding simulator such that the previous and current simulator states can be provided to the instructor module 224 for determining the prediction that offers a best reward subsequent to the training.

Not only do the learning agents 327a, 327b, ..., 327n track dependencies of the data from the simulators 319a, 319b, ..., 319n for training the AI models and previous and current simulator states of the simulators 319a, 319b, ..., 319n for the instructor module 224, but the learning agents 327a, 327b, ..., 327n are further configured to track, categorize, or both track and categorize simulator experience gatherings, prediction requests, and training requests to allow data transformation to be handled by the AI engine in an asynchronous way. For example, the learning agents 327a, 327b, ..., 327n are configured to process training requests from the instructor module 224 on the simulator-specific streams of data from the simulators 319a, 319b, ..., 319n for asynchronously training the AI models.

FIG. 4 provides a schematic illustrating data flow through the number of simulators 319a, 319b, ..., 319n, the learner module 228, an asynchronous round-robin handler or algorithm 423, and the predictor module 229 of the AI system in accordance with an embodiment. As shown, the simulator-specific streams of data from the simulators 319a, 319b, ..., 319n for training the AI models are synchronously pooled in a memory 400 of the learner module of the learner 228, if needed, for subsequent processing by a processor 402, such as the CPU, GPU, or DSP of the one or more processors, as appropriate. The synchronously pooled simulator data is then asynchronously handled by the asynchronous round-robin handler 423 for processing by the CPU, GPU, or DSP. Other data streams such as simulator experience gatherings, prediction requests, and completed or processed training requests are handled synchronously as shown. As such, the AI system is configured for interleaving data, requests such as prediction and training requests, and/or the like.

Synchronously pooled simulator data is asynchronously handled by the asynchronous round-robin handler 423 for processing by the CPU, GPU, or DSP of the one or more processors, as appropriate, such as when a threshold amount of like or similar data is pooled from the simulators 319a, 319b, ..., 319n. The asynchronous round robin handler 423 is configured to check data batch sizes for batches of like or similar data synchronously pooled in the memory of the learner module to ensure data batch sizes meet or exceed a threshold level. The asynchronous round robin handler 423 is configured to check the data batch sizes before any CPU, GPU, or DSP of the one or more processors is committed by the AI engine to train the AI models on any of the batches of like or similar data. For example, the learner module 228 is configured to train the AI models on a first batch of like or similar data synchronously pooled in the memory of the learner module with a first CPU, GPU, or DSP of the one or more processors, as appropriate, when the first batch of data has a data batch size meeting or exceeding a threshold level. The learner module 228 is then configured to train the AI models on a second, different batch of like or similar data synchronously pooled in the memory of the learner module with the first CPU, GPU, or DSP of the one or more processors, as appropriate, when the second batch of data has a data batch size meeting or exceeding the threshold level, and so on. The data batch size meeting or exceeding a threshold level can depend upon the number of AI models being trained in parallel.

In addition to coordinating resource utilization of the CPU, GPU, or DSP of the one or more processors in accordance with the foregoing, the asynchronous round robin handler 423 is further configured to coordinate resource utilization of the CPU, GPU, or DSP of the one or more processors by staggering training-cycle steps for the AI models using queues that desynchronize i) simulator experience gatherings, ii) prediction requests, and iii) training requests. Simulator experience gatherings and prediction requests can be synchronously passed through the AI engine as shown in FIG. 4, but the asynchronous round-robin handler 228 is configured to schedule the training requests in accordance with data batch sizes of like or similar data before any CPU, GPU, or DSP of the one or more processors is committed by the AI engine to train the AI models on any of the batches of like or similar data.

FIG. 5A and FIG. 5B provide schematics illustrating reduced iteration time for training a number of AI models with a number of simulators in parallel resulting in increased utilization of one or more processors in accordance with an embodiment. FIG. 5A provides a schematic illustrating serial training of a number AI models with the simulators 319a, 319b, ..., 319n, in which data flows from, for example, the simulator 319a in a first iteration, through the instructor module 224, the learner 228, and to the predictor 229 before a first iteration of the simulator 319b occurs. Data then flows from the simulator 319b in the first iteration, through the instructor module 224, the learner 228, and to the predictor 229 before a first iteration of a next simulator occurs, and so on. In contrast, FIG. 5B provides a schematic illustrating parallel training of a number AI models with the simulators 319a, 319b, ..., 319n, for reduced iteration time resulting in increased utilization of the one or more processors. As shown, data flows from, for example, the simulator 319a in a first iteration to the instructor module 224, after which data flows from the simulator 319b in a first iteration to the instructor module 224, after which data flows from a next simulator in a first iteration to the instructor module 224, and so on. The learning agents 327a, 327b, ..., 327n are configured to track dependencies of such data from the simulators 319a, 319b, ..., 319n for training the AI models, wherein tracking the dependencies of the data from the simulators 319a, 319b, ..., 319n enables streams of the data from the simulators 319a, 319b, ..., 319n to be separated into the simulator-specific streams for processing by the instructor module 224, the asynchronous round-robin handler 423, the learner module 228, and the predictor 229. As such, iteration time for a simulator (e.g., simulator 319a) of the simulators 319a, 319b, ..., 319n trends toward running the simulator (e.g., simulator 319a) serially, by itself, as opposed to the iteration time for the simulator (e.g., simulator 319a) in FIG. 5A, which iteration time depends upon a number of intervening simulators also running in serial. In an embodiment, for example, the AI engine is configured to train at least 8 AI models with a respective number of simulators on a single-enclosure machine as the one or more computer platforms for an optimized training of the AI models.

On-Premises Installation

With respect to an on-premises installation, all software needed for at least basic operation of the AI engine is installed on an organization's own hardware, for example, in a data warehouse. The AI engine or the organization's hardware on which the AI engine is installed can have network access, limited network access, or no network access outside the organization.

Reasons for an on-premises installation of the AI engine include, but are not limited to, one or more of the following: 1) No or limited Internet access restricting data transfers. For example, there might be a prohibitively large amount of data (e.g., simulator data) to send to a cloud-based platform for training an AI model. 2) Data locality. For example, a user might want to have immediate access to data or tight control over the data. 3) Choice of hardware. A user might want different CPUs/GPUs, different number of CPUs/GPUs, different ratios of CPUs/GPUs on an on-premises installation than what is available in a cloud-based platform. 4) Complete or total administrative rights over hardware.

An on-premises installation of the different processes of the AI engine may occur using Salt or some other similar configuration management technology. The AI engine can be adapted to accommodate different configurations of hardware on the customer's premises.

Salt or some other similar configuration management technology as well as the system can be adapted to install the different configurations and processes of the AI engine. As discussed, a different configuration software package (e.g., Ansible, Chef, Puppet, etc.) can be used rather than the example Salt discussed herein.

The system may install different image files, engines, containers for programs or services defined in the image files, or a combination thereof for the AI engine on a customer's premises with Salt or another configuration software package and then create a cluster of nodes or machines. An installer script of the multiple independent processes is configured to install on an available hardware architecture of the one or more computing platforms. The first service is further configured to direct a first CPU computing device to load and run an architect process, a second CPU computing device to load and run an instructor process, and a first GPU computing device to load and run a learner process. The first service is further configured to assign roles of those processes to run on the available hardware architecture of the one or more computing platforms.

In a first step, the system finds out how many machines are available on premises for the AI engine, which AI engine is configured to create, train, and manage one or more AI models or "BRAINs." Next, the system can allocate Internet Protocol ("IP") addresses for the customer's machines and then copy the scripts for the independent processes onto the customer's machines. Then, the system runs the generic script to install the different independent processes, each in its own container. In an embodiment, the system has generated a light set of the current set of 12-20 containerized independent software processes to be reduced down to a lower amount if needed for any generic set up and then can customize the installation based on that customer's particular needs. For example, the light set might eliminate a Mongo DB, a time-series database such as an InfluxDB time-series database, an AI-model service including an architect module, an AI compiler, an AI-model web service, a conductor service, a watchman service, a CPU Engineer service, a predictor service, etc. In an embodiment, the system is configured to code the containers to run on different hardware processors found on the customer's premises such as Intel x86 processors, as well as, if detected, an IBM power8 processor.

Setup and Deploy

Provided herein is an AI engine and simulation platform designed for at least a number of on-premises users, enabling:

Simulation workloads, which are an important part of the AI engine and simulation platform, to be done on premises;

Edge device (Internet of Things and robots) use cases;

Fewer concerns such as network reliability, privacy and security concerns around proprietary data, sensitive applications, compliance, security etc.; and Customers having their own cloud (e.g., private cloud) as an option for an on-premises solution.

The aim is to provide enterprise customers and users, Information Technology ("IT") administrators ("IT admins"), customer success managers ("CSMs"), roboticists, developers, and data engineers (or members) with a platform capability across different hardware environments, the platforms including on-premises configurations for any AI-specific hardware (e.g., IBM Minsky, nVidia DGX), edge devices (e.g., computer next to a CNC machine), or combinations thereof; cloud configurations including public clouds (e.g., AWS, Azure, etc.), virtual private clouds ("VPCs") in public clouds, private clouds (e.g., including on-premises clouds); or a combination thereof such as a hybrid configuration including a mixture of an on-premises installation with one or more public, virtual private, or private clouds with an orchestration between the platforms. This empowers customers and users to optimize and control for their respective use cases, by means of a) installing the platform in a cloud (e.g., private cloud) or on premises to train the AI models and utilize the computing power of the cloud while maintaining security and privacy; b) deploying the trained AI model in the cloud (e.g., private cloud) for predictions or tuning; and c) deploying the trained AI model on premises for predictions or tuning.

The multiple independent processes may be configured as an independent process wrapped in its own container so that multiple instances of the same processes, (e.g., learner process and instructor process), can run simultaneously to scale to handle one or more users to perform actions to solve AI problems. The actions to solve AI problems can include 1) running multiple training sessions on two or more AI models at the same time, in parallel 2) creating two or more AI models at the same time, 3) running a training session on one or more AI models while creating one or more AI models at the same time, 4) deploying and using two or more trained AI models to do predictions on data from one or more data sources, and 5) any combination of these four, on the same artificial intelligence engine. A service, such as an engineer service, of the independent processes can be configured to handle scaling by dynamically calling in additional computing devices to load on and run additional instances of one or more of the independent processes wrapped in its own container, such as the learner process and/or instructor process, as needed to handle all of the users and their AI problems.

Concepts and Mental Models

FIGS. 6A and 6B provide schematics respectively illustrating mental models 600A and 600B in accordance with an embodiment.

Pedagogical programming focuses on codifying two main pillars: 1) What are the concepts associated with the problem domain (and mentally how do they relate to each other)? 2) How would one go about teaching those concepts?

A concept is something that can be learned. Once learned it can provide intelligent output. An AI object may learn and be trained on a particular concept. An AI object corresponding to a particular concept can receive input data from other AI objects/concepts and simulators, and send output data to other AI objects/concepts or as a AI object corresponding to a main concept produce a final result/output. A concept can be used in isolation, but it is typically more useful to construct some structured relationship of connectivity, such as a hierarchy, between the related concepts, beginning with the relatively simple concepts and then building into more complex concepts. For example, 'ball location' is a relatively simple concept; whereas, 'get high score' with the ball is a more complex concept. In another example, a complex mental model of flying a plane may have a main concept of 'flying a plane' and numerous sub concepts such as 'how to navigate and move a plane from point A to point B', 'how to avoid crashing into objects', 'how to take off into flight', 'how to land from flight', etc. Each of the sub concepts feeds one or more outputs either directly or indirectly into the main concept of 'flying a plane' when undergoing training on the main concept. The architect module 226 creates the structured relationship of connectivity between these concepts based on user supplied guidance in the pedagogical programming language code. Both FIGS. 6A and 6B show mental models including the strategy-type concept "get high score."

A mental model in a pedagogical programming language is also something that an AI object can be trained on and learn. A mental model can include one or more concepts structured in terms of the one or more concepts, and the mental model can further include one or more data transformation streams. As shown in FIG. 6A, a single-concept mental model can include, for example, a strategy-type concept such as "get high score." As shown in FIG. 6B, a multi-concept mental model can include a hierarchical structure including, for example, strategy-type concepts such as "keep paddle under ball" and "get high score" and state-type concepts such as "ball location." The sub concepts of "keep paddle under ball" and "ball location" feed parameters directly or indirectly into the main concept of "get high score" with the ball. A concept in a multi-concept mental model can receive input from other concepts in the mental model, send output to other concepts in the mental model, provide a final output or result output, or a combination thereof. Addition of more concepts to a mental model can decrease training time for an AI object, as well as enable a trained AI object to give smarter, more accurate predictions. Each trained concept may be AI object.

Curricula and Lessons. A Curriculum is used to teach a concept. To do this, the user needs to provide data to train the concept and tell the AI engine whether the system's understanding of the concept is correct or not. This is analogous to a teacher assigning readings from a book to a student and subsequently testing the student on the contents of the book. The ways in which this data is presented is broken into individual components called Lessons. In the book analogy, Lessons could be individual chapters in the book. Lessons allow the concept to learn bit-by-bit, rather than all at once.

The concept keyword declares an abstract concept that is to be learned by the system. Ultimately, this takes the form of a transformation of data, but no information need be provided about how to perform the calculation. By declaring a concept in the scripted in a pedagogical software programming language, the programmer instructs the architect module 226 of the AI engine that this is a node in the recurrent AI network making up the AI model that must be learned. Consequently, each concept node must have corresponding curricula to teach that node of performing its output function based on its input parameters.

Because concepts are learned by each AI model, their declarations tend to be fairly simple unless one wants to explicitly tell the architect module 226 of the AI what learning algorithms and architecture to use. A typical statement will look something like this:
concept AbstractConceptName
is estimator, classifier, etc.
follows AntecedentConcept1, AntecedentConcept2
feeds DependentConcept1

An example of a trained AI model may be a Basic Recurrent Artificial Intelligence Network (BRAIN). A BRAIN is an individual AI agent, and it is programmed to learn using a software language such as Inkling™. Each BRAIN can reside in the AI engine, which manages and automates much of the lower level, complexities of working with AI. At its heart, a BRAIN can be a basic network of intelligent processing nodes that include a potentially recurrent network, hence the acronym "BRAIN." In an embodiment, a trained AI model, such as trained AI model 106, may be a pedagogically programmed AI model that has been trained on one or more concepts.

The Multiple Independent Processes Carry Out Four or More Separate Tasks

Multiple independent processes in an AI engine carry out four or more separate tasks by 1) interaction with and 2) cooperation between the multiple independent processes. A first task can be creating a shell of an AI model, such as creating a shell of a BRAIN. A second task can be loading in a file of scripted code in a programming language to help define a topology of processing nodes in the AI model, a layout of the concepts making up the AI model, and a selection of an appropriate learning algorithm(s) for the AI model. The file created in the pedagogical software programming language, such as Inkling™, helps the architect module to create the structural details and other details of the AI model. The third task can be starting to train the AI model with a data source, such as a simulator. The fourth task can be then deploying a trained AI model and using the trained AI model to do predictions on data from the data source.

Some of the major independent processes configured into the AI engine can be as follows. An AI-model service may include a HTTP application programming interface, an AI compiler, and an architect module. Note, the architect module could be 1) an independent process on its own or 2) part of the AI-model service as here in this example. Another independent process is the instructor process and CPU engineer service. Another independent process is the predictor process. Another is the watchman process. Another is the learner process with its GPU engineer service. Another is the conductor. Another is the AI-model web service. Note, most of these processes are standalone services but they can be incorporated into a larger coding file to be part of another service or process. A software container is configured to wrap one or more pieces of software in a complete file system containing everything for execution including code, runtime, system tools, system libraries, etc. Note, the HTTP API may be a restful API. Note, an API may allow the on-premises installation have direct access to the modules of the AI engine.

In an embodiment, the CPU engineer may be coded to invoke and put processes onto the CPU computing devices including instances of the instructor process and predictor process, when needed. The GPU engineer may be coded to invoke and put, for example, instances of the learner process onto the GPU hardware as needed. The conductor service and/or engineer service may be configured to handle scaling by dynamically calling in additional computing devices to load on and run additional instances of one or more of the independent processes wrapped in its own container, such as the learner and/or instructor, as needed. When instances of the learner process and/or instructor process are not available to effectively run a training session of a given AI model, then a new instance of the learner process and/or instructor process is invoked and run on a computing device.

The multiple independent processes are further configured as an independent process wrapped in its own software container so that multiple instances of the same processes can run simultaneously in order to scale to handle one or more users to perform actions to solve AI problems. The actions to solve AI problems can include 1) running multiple training sessions on two or more AI models at the same time, in parallel 2) creating two or more AI models at the same time, 3) running a training session on one or more AI models while creating one or more AI models at the same time, 4) deploying two or more trained AI models and using the trained AI models to do predictions on data from one or more data sources, and 5) any combination of these four, on the same AI engine. In an embodiment, five or more simulations may be simultaneously running at the same time. In an embodiment, ten or more training sessions may be simultaneously running at the same time. In an embodiment, twenty or more training sessions may be simultaneously running at the same time.

A first service of the independent processes is configured to handle scaling by dynamically calling in additional computing devices to load on and run additional instances of one or more of the independent processes wrapped in its own container as needed. An independent process, such as a scheduler, monitors the amount of the available hardware resources, such as percent resources used. An independent process, such as the scheduler, also looks at the incoming resource requests from, for example, the amount of AI model deployments and training sessions occurring on the single AI engine, in order to decide to dynamically change the amount of computing devices operating instances of the independent processes that are in containers. The scheduler may cooperate with or be part of CPU engineer service, conductor service, and/or GPU engineer service. The scheduler may assign a role to each individual process, use an auto scaling service to scale the processes in their software containers in response to load across the systems services, and use a Load Balancer to distribute load across a current set of computing devices, while automatically checking new tasks into the load balancer when auto scaling actions occur. When the scheduler is asked to run a new task, the scheduler determines the individual processes, each in their own containers needing to accomplish the task, and then finds a suitable set of one or more computing machines to run the individual processes by identifying an instance in the cluster of computing devices with available resources. Long running processes, such as an instance of the learner and instance of the instructor, conducting a training session for a particular AI model could each run on its own GPU or CPU computing device in the cloud. An individual AI model being trained may only take a part of a CPU's capacity or may take up an entire GPU's capacity to train that AI model at that time. Multiple instances of the independent processes may be invoked to handle multiple AI models being trained in parallel or being deployed at the same time simultaneously. Note, each of the AI models may be training or being deployed to solve an identical problem or a completely different problem in completely different technologies.

The first task can be creating a shell of an AI mode. In an embodiment in the first task, an architect module of the AI-model service receives a request from a client device of the user to create an AI model. Anyone of three or more different user interfaces may supply a command to request the creation of an AI model. The three different user interfaces are a command line interface, a web interface, and a graphical user interface such as Mastermind™. The three different user interfaces allow for multiple users of different levels of capability and programming to all utilize the AI engine hosted on this cloud platform. A request comes in to create an AI model into the AI-model web interface. The AI-model service is called by the AI-model web interface to create an AI model record for that user. The AI-model web interface may also make a call to a user's database in order to verify the account of the user and call up any previous information including account information about the user. The AI-model service then creates an AI model document by calling over to the AI database, for example, the MongoDB document database. The AI-model service registers the request and sends it on to the AI database. The AI database creates a new shell document to contain an AI model to be fleshed out with details and then trained. The new shell will have a unique ID number or at least a unique version of that ID model. When success is indicated, then the AI-model service via the AI-model web interface sends back to the client device of the user of the cloud platform that the initial shell document of the AI model has been successfully created. Thus, the AI-model service registers an incoming request and then creates a shell for the AI model with the architect module. Note, the architect module may be its own independent process in its own container or part of the AI-model service in its container.

The second task can be loading in a file of scripted code in the pedagogical software programming language to help define 1) a topology of processing nodes in the AI model, 2) a layout of the concepts making up the AI model, 3) a selection of an appropriate learning algorithm for the AI model, and 4) other similar details in order to flesh out the details of the AI model and then instantiate the AI model. In an embodiment in the second task, an architect module of the AI-model service receives scripted code to create a topology of neural networks, select one or more learning algorithms, and then instantiate an AI model assigned with a unique identifier, all based on a description of a problem to solve codified in a pedagogical software programming language. The loading of the file written in the pedagogical software programming language occurs. The file written in the pedagogical software programming language is put through a restful web socket. The file is sent to the AI-model service and then the AI-model service applies the AI compiler, which uses a library with executables to compile the scripted code and parse through the scripted code to detect errors in the syntax of the code, etc. The file created in the pedagogical software programming language, such as Inkling™, helps the architect module to design a graph of concepts, etc. in the AI model. The architect module of the AI-model service fills out a topology of the processing nodes in the model, a layout of the concepts making up the AI model, and selected appropriate learning algorithm(s) for this AI model into the shell of the AI model. The architect module may look at the type of problem being solved in the pedagogical software programming language and see what similar architectures have worked to solve a similar problem. The architect module portion of the AI-model service also then instantiates, for example, the topology for neural networks and graph of concepts for each concept node derived from statements written in the codified pedagogical software programming language. After the shell of the AI model with the topology of the graph of processing nodes is created with the appropriate learning algorithm(s) and has been assigned a unique ID, then the AI database stores the AI models as well as portions of AI models. After the shell of the AI model with the topology of the graph of processing nodes is instantiated with the appropriate learning algorithm(s) and has been assigned a unique ID, then the next task starts, which is training an instantiated AI model with a data source.

The third task is starting to train the AI model with some sort of data source, such as a simulator, according to a lesson plan and curriculum. In an embodiment in the third task, an instructor process is configured to carrying out a training plan codified in a pedagogical software programming language. The learner process is configured to carrying out an actual execution of underlying AI learning algorithms during the training session. The learner module can also consistently update weights of the learning algorithm(s) in the AI model. The instructor process and the learner process of the independent processes cooperate with one or more data sources to train a new AI model. The conductor, via an API, receives a start and set up training command. The conductor may be coded as a service. The conductor service in combination with the AI-model service can be the components in the system responsible for coordinating activities between the instructor process, the learner process, and the training data source. In an embodiment, the conductor is a Docker-type service.

In an embodiment, a client device of the user starts the training of an AI model, via a user interface, by sending a call command to send to train the AI model to the AI-model service. The AI-model service then sends a start training components command to the conductor. The conductor then sends a request to the AI database to retrieve the instantiated AI model. In an embodiment, the copy of the latest version of the AI model is retrieved. Note, in an embodiment, the conductor obtains multiple versions of the AI model, potentially with different neural networks and learning algorithms in order to train two or more instances of this AI model in parallel on the same AI engine. Each AI model is then trained with its own instances of the independent processes of the learner and instructor. The conductor sends a start instructor command to the CPU engineer, which then starts an instance of the instructor process on a CPU computing device. The CPU engineer invokes as many instances of the instructor process as necessary/as needed to service the multiple AI model's being trained. Each time another AI model is being trained another instructor process may be invoked. The conductor also sends a start learner command, via a call, to the GPU engineer. The GPU engineer invokes and starts an instance of a learner module on an available GPU computing device. The GPU engineer invokes as many instances of the learner process as necessary/as needed to service the multiple AI model's being trained. Once the instance of the instructor is loaded onto and running on the CPU hardware, the instructor then may go to the AI database to get the curriculum and lessons from the AI database. Training lessons may come from the pedagogical software programming language file, which was compiled and put into the AI database as a document associated with this AI model being trained. Similarly, the learner process once started will send a command to the AI database to get a document of the concepts, their curriculum, and the individual lessons to be trained on, which can be derived from the codified pedagogical software programming language and/or reference databases of best training practices. Note, the learner may receive most of the commands on the training from the instructor process conducting the training session in accordance with the curriculum and individual lesson plans.

Next for the training, the data sources register with the AI-model web interface. The AI-model service opens the web socket, for example, for simulation through the open web socket. The AI-model service acknowledges the registration with the data source. The AI-model service then directly talks to the instructor process that a data source is ready to start sending data to the instructor process. The instructor process sends back that it is ready to start the training. A start command to the data source, such as a simulator, random data generator, etc. is initiated. The data source then connects to the AI model. A recursive and reiterative loop occurs between the instructor process, the learner process, and the data source to send data to the AI model for training. Based on the new data, the AI model updates the state information of different portions making up the AI model and the instructor process sends the updated state information back to the data source. The data source sends more data and/or a prediction to the instructor process. This loop occurs between the instructor and the data source to send data and/or predictions, update and run the training, get back state, and then repeat.

Also, the instructor process can send state and prediction information to the learner process. Thus, in the recursive and reiterative loop, the learner process takes part in training of the instantiated AI model with the state information and predictions. The learner records the new state data for the AI model. The learner process records the episodes and reward information into a time database and sends the current function objective value back to the instructor process. The reiterative loop occurs between training with state and predictions, recording the reward information, and sending back the objective value and a current function occurs between the instructor and the learner. The learner continuously writes to the instructor with the state of the training and writes out new weights for the learning algorithms. Based on constraints or other statements in the code, such as Inkling™, eventually the learner knows when to stop the reiterative loop of sending data between the data source, training with that data, making predictions, adjusting coefficient weights, and getting better accuracy with the trained AI model. In the end, the criteria of the trainings are achieved. The instructor process will write out the trained network data to the AI database, where the model being trained has its own unique ID. The overall trained AI model will have learned optimum weights for the coefficients of the learning algorithms for each trained AI object corresponding to either a main concept or sub concept forming the trained AI model. The trained AI model with its unique ID and version of that AI model is then stored in the AI database.

The independent processes include a watchman service configured to monitor to see if any of 1) when failures occur in any of the other independent processes and 2) when any of the other independent processes exit, and then to tell all of the independent processes that were participating in that training to exit the training session that they were cooperating in. Similarly, the watchman service can monitor deployment and use sessions with the trained AI model and/or AI model creation sessions to tell all of the independent processes that were participating in that AI event to exit when a failure occurs or when one of the other independent processes exit.

The fourth task is then deploying a trained AI model and using the trained AI model to do predictions and/or other actions on data from one or more data sources, such as a simulator, random data generator, database, etc.

A trained AI model may then be used to predict many things. For example, trained AI model connected to a data source may predict what will occur 1) during an example simulation or 2) during real time streaming such as during a video game to make decisions for the digital creatures in that game, based on the training in the AI model. The data source connects to the trained AI model with a command to the AI-model service. The AI-model service then makes a call to the instructor process to launch a predictor process and to tell the instructor process that registration has occurred. The AI-model service loads the trained AI model. The AI-model service opens up the AI document database for registration. The AI-model service opens up a website socket for simulation. In addition, the AI-model service connects back to the data source and conveys that the data source is registered and that the predictor process is ready to start. Lastly, a loop repeats to start the simulation, send that data to the predictor, and the predictor then makes predictions based on the trained AI models, which are then sent back to the data source until the deployment of the AI model ends.

Note, the AI system uses software defined processes wrapped in a container over using individual daemons because the software defined processes, each in its own container, scale better to a dynamically changing amount or set of hardware configuration. The AI engine decoupled from using a set of daemons as coordinating agents between different functions in an AI engine, over to instances of self-sufficient independent processes, so that the AI engine system can scale to handle multiple users at the same time using the single AI engine hosted on the cloud platform. The multiple users may be creating AI models as well as training AI models.

Each module can be structured as an independent process so it may work with other processes but can exist outside and run its function without the need of the other processes.

More on the AI Engine

The AI system enables developers to more efficiently build, teach, and use intelligence models.

The AI engine takes in a description of a problem and how one would go about teaching concepts covering aspects of the problem to be solved, and the AI engine compiles the coded description into lower-level structured data objects that a machine can more readily understand, builds a network topology of the main problem concept and sub-concepts covering aspects of the problem to be solved, trains codified instantiations of the sub-concepts and main concept, and executes a trained AI model containing one, two, or more neural networks.

The AI engine can contain a vast array of machine learning algorithms, has logic for picking learning algorithms and guiding training, manages data streaming and data storage, and provides the efficient allocation of hardware resources. The AI engine can be built with an infrastructure that supports streaming data efficiently through the system. The AI engine can use a set of heuristics to make choices about which learning algorithms to use to train each AI model. The set of heuristics also make it possible for the AI engine to choose from any number of possible algorithms, topologies, etc., be able to train a number of AI models in parallel, and then pick the best result from all of the trained AI models as the best trained AI model for that task.

Major Components of the AI Engine

FIG. 7 provides a block diagram illustrating an AI system including an AI engine in accordance with an embodiment.

The details for any given implementation of an AI engine may vary substantially, but many have common architectural components such as the following six components: 1) an architect module 226, 2) an instructor module 224, 3) a learner module 228, 4) a compiler module 222, 5) a hyperlearner module 225, and 6) one or more interfaces 212 exchanging communications into and out of the AI engine. The AI database 241 may cooperate with the modules of the AI engine as discussed above.

The AI engine can be a cloud-hosted platform-as-a-service configured to manage complexities inherent to training AI networks. Thus, the AI engine can be accessible with one or more client-side interfaces 212, GUI, CLI, and Web interfaces, to allow third parties to submit a description of a problem in a pedagogical programming language with possible sub concepts that factor in that problem and let the online AI engine build and generate a trained intelligence model for one or more of the third parties.

The AI system includes the coder 212 on the one or more client systems and the following on the one or more server systems: the AI compiler module 222; the AI-generator modules including the instructor module 224, the architect module 226, and the learner module 228, the hyperlearner 225, and the predictor 229 module 229. In addition to the foregoing, the AI system can include a training data loader 621 configured to load training data from a training data database 614a, a simulator 614b, and a streaming data server. The training data can be batched training data, streamed training data, or a combination thereof, and the AI engine can be configured to push or pull the training data from one or more training data sources selected from the simulator 614b, a training data generator, the training data database 614a, or a combination thereof. In an embodiment, a data stream manager can be configured to manage streaming of the streamed training data. FIG. 7 shows the architect module 226 configured to propose a neural network layout and the learner module 228 configured to save a trained state of a neural network such as the trained AI model 106.

The AI compiler module 222 automates conversion and compiling of the pedagogical programming language describing the problem (main concept) and sub-concepts factoring into the problem. Each statement recited in the code of the pedagogical programming language program submitted to the AI engine can be complied into a structured data object's defined fields, which can later be generated and instantiated into its own sub-concept node by the architect module 226. Each node can have one or more inputs one or more neural networks to process the input data and a resulting output decision/action. The compiled statements, commands, and other codifications fed into the AI compiler can be transformed into a lower level AI specification.

The Architect Module

The architect module 226 is the component of the system responsible for proposing and optimizing learning topologies (e.g., neural networks) based on mental models.

Neural networks can be based on a large collection of neural units loosely modeling the way a biological brain solves problems with large clusters of biological neurons connected by axons. Each neural unit is connected with many others, and links can be enforcing or inhibitory in their effect on the activation state of connected neural units. Each individual neural unit can have, for example, a summation function, which combines the values of all its inputs together. There may be a threshold function or limiting function on each connection and on the unit itself such that it must surpass it before it can propagate to other neurons. These systems are self-learning and trained rather than explicitly programmed and excel in areas where the solution or feature detection is difficult to express in a traditional computer program.

The architect module 226 can take the codified mental model and pedagogy and then propose a set of candidate low-level learning algorithms, topologies of a main concepts and sub-concepts, and configurations thereof the architect module 226 believes will best be able to learn the concepts in the model. In an embodiment, for example, the architect module 226 can be configured to propose a number of neural networks and heuristically pick an appropriate learning algorithm from a number of machine learning algorithms in one or more databases for each of the number of neural networks. Instances of the learner module 228 and the instructor module 224 can be configured to train the number of neural networks in parallel. The number of neural networks can be trained in one or more training cycles with the training data from one or more training data sources. The AI engine can subsequently instantiate a number of trained AI models based on the concepts learned by the number of neural networks in the one or more training cycles, and then identify a best trained AI model (e.g., by means of optimal results based on factors such as performance time, accuracy, etc.) among the number of trained AI models.

The Instructor Module

The instructor module 224 is a component of the system responsible for carrying out a training plan codified in the pedagogical programming language. Training can include teaching a network of intelligent processing nodes to get one or more outcomes, for example, on a simulator. To do so, the instructor module 224 can form internal representations about the system's mastery level of each concept, and adapt the execution plan based on actual performance during training. The directed graph of lessons can be utilized by the instructor module 224 to determine an execution plan for training (e.g., which lessons should be taught in which order). The training can involve using a specific set of concepts, a curriculum, and lessons, which can be described in the pedagogical programming language file.

The instructor module 224 can train easier-to-understand tasks earlier than tasks that are more complex. Thus, the instructor module 224 can train sub-concept AI objects and then higher-level AI objects. The instructor module 224 can train sub-concept AI objects that are dependent on other nodes after those other AI objects are trained. However, multiple nodes in a graph may be trained in parallel. The instructor module 224 can run simulations on the AI objects with input data including statistics and feedback on results from the AI object being trained from the learner module 228. The learner module 228 and instructor module 224 can work with a simulator or other data source to iteratively train an AI object with different data inputs. The instructor module 224 can reference a knowledge base of how to train an AI object efficiently by different ways of flowing data to one or more AI objects in the topology graph in parallel, or, if dependencies exist, the instructor module 224 can train serially with some portions of lessons taking place only after earlier dependencies have been satisfied. The instructor module 224 can reference the dependencies in the topology graph, which the dependencies can come from a user specifying the dependencies and/or how the arrangement of AI objects in the topology was instantiated. The instructor module 224 can supply data flows from the data source such as a simulator in parallel to multiple AI objects at the same time where computing resources and a dependency check allows the parallel training.

The instructor module 224 may flow data to train AI objects from many data sources including, but not limited to a simulator, a batch data source, a random-data generator, and historical/guided performance form from past performance. A simulator can give data and get feedback from the instructor module 224 during the simulation that can create an iterative reactive loop from data inputs and data outputs from the AI objects. A batch data source can supply batched data from a database in at least one example. A random-data generator can generate random data based on user-input parameters.

When starting a training operation, the instructor module 224 first generates an execution plan. This is the ordering it intends to use when teaching the concepts, and for each concept which lessons it intends to teach in what order. While the execution plan is executing, the instructor module 224 may jump back and forth between concepts and lessons to optimize the learning rate. By not training each concept fully before starting to train dependent concepts, the system naturally avoids certain systemic machine learning problems such as overfitting. The major techniques used to determine when to switch between lessons and concepts for training are reinforcement learning and adaptive learning. For example, for a first main problem of determining an amount of bankruptcy's in the United States, a first AI object corresponding to a sub concept node may be trained in a first lesson on how to determine bankruptcy filings in California. A second lesson may train the first AI object next on how to determine bankruptcy filings in California and York. Successive lessons on an AI object can build upon and augment earlier lessons that the AI object was trained on.

The instructor module 224 looks to reuse similar training flows that have solved similar problems with similar signatures in the past.

Learner Module

The learner module 228 is a component of the system configured to carry out the actual execution of the low-level, underlying AI algorithms. In training mode, the learner module 228 can instantiate a system conforming to what was proposed by the architect module 226, interface with the instructor module 224 to carry out the computation and assess performance, and then execute the learning algorithm itself. The learner module 228 can instantiate and execute an instance of the already trained system. Eventually, the learner module 228 writes out network states for each trained sub-AI object and then a combination of the topological graph of the main node with all of the sub-nodes into a trained AI model. The learner module 228 can also write the stored output of each concept node and why that concept node arrived at that output into the trained AI model, which gives explainability as to how and why the AI proposes a solution or arrives at an outcome.

Hyperlearner Module

The hyperlearner module 225 can perform a comparison of a current problem to a previous problem in one or more databases. The hyperlearner module 225 can reference archived, previously built and trained intelligence models to help guide the instructor module 224 to train the current model of nodes. The hyperlearner module 225 can parse an archive database of trained intelligence models, known past similar problems and proposed solutions, and other sources. The hyperlearner module 225 can compare previous solutions similar to the solutions needed in a current problem as well as compare previous problems similar to the current problem to suggest potential optimal neural network topologies and training lessons and training methodologies.

Simulator

When, the curriculum trains using a simulation or procedural generation, then the data for a lesson is not data to be passed to the learning system, but the data is to be passed to the simulator. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a client machine and stream data to the AI engine for training. In such an embodiment, the client machine needs to remain connected to the AI engine while the AI model is training. However, if the client machine is disconnected from the server of the AI engine, it can automatically pick up where it left off when it is reconnected. Note, if the system trains using data, then the data is optionally filtered/augmented in the lessons before being passed to the learning system.

Note, 1) simulations and procedural generation are a good choice versus data in a variety of circumstances; and 2) concepts are a good choice versus streams when you can more easily teach versus calculate.

Training Mode

A machine learning algorithm may have of a target/outcome variable (or dependent variable) which is to be predicted from a given set of predictors (independent variables). Using this set of variables, the AI engine generates a function that maps inputs to desired outputs. The coefficients and weights plugged into the equations in the various learning algorithms are then updated after each epoch/pass of training session until a best set of coefficients and weights are determined for this particular concept. The training process continues until the model achieves a desired level of accuracy on the training data.

When in training mode the architect module 226 of the AI engine is configured to i) instantiate the network of processing nodes in any layers of hierarchy conforming to concepts of the problem being solved proposed by the user and ii) then the learner module 228 and instructor module 224 train the network of processing nodes in that AI model. To effect the foregoing, the AI engine can take compiled pedagogical programming language code and generate a AI-model learning topology, and proceed to follow the curricula to teach the concepts as specified. Depending on the model, training can potentially take substantial amounts of time. Consequently, the AI engine can provide interactive context on the status of training including, for example, showing which nodes are actively being trained, the current belief about each node's mastery of its associated concept, overall and fine-grained accuracy and performance, the current training execution plan, and/or an estimate of completion time. As such, in an embodiment, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the AI engine in training mode can also provide incremental training. That is to say, if the pedagogical programming language code is altered with respect to a concept that comes after other concepts that have already been trained, those antecedent concepts do not need to be retrained.

Additionally, in training mode, the user is able to specify what constitutes satisfactory training should the program itself permit indefinite training.

Training in Parallel

In an embodiment, upon execution of the instructor module by a first processor and learner module by a second processor of the one or more processors, the learner module is configured to train a number of AI models in parallel on one or more concepts, and the instructor module is configured to coordinate with a number of simulators for respectively training the AI models on the one or more concepts. The number of learning agents respectively correspond to the number of AI models, are the learning agents are configured to process training requests from the instructor module on data from the simulators for training the AI models. In addition, the learner module is further configured to train the AI models on a first batch of like or similar data synchronously pooled in a memory of the learner module with a first CPU, GPU, or DSP of the one or more processors, as applicable. The learner module is configured to then train the AI models on additional sets of data, such as a second different, batch of like of similar data synchronously pooled in the memory of the learner module with the first CPU, GPU, or DSP of the one or more processors, as applicable.

In an embodiment, the asynchronous round robin handler is further configured to stagger steps of a training cycle for each of the AI models using queues that desynchronize i) simulator experience gatherings, ii) prediction requests, and iii) training requests. The simulator experience gatherings, prediction requests, and training requests are categorized as such by the learning agents to allow data transformation to be handled in an asynchronous way.

In an embodiment, the learning agents are further configured to track dependencies of the data from the plurality of simulators for training the plurality of AI models. Tracking the dependencies of the data from the simulators enables streams of the data from the plurality of simulators to be separated into simulator-specific streams.

In an embodiment, the asynchronous round robin handler is configured to check data batch sizes for batches of like or similar data synchronously pooled in the memory of the learner module to ensure data batch sizes meet or exceed a threshold level. The asynchronous round robin handler is configured to check the data batch sizes before any CPU, GPU, or DSP of the one or more processors for training use for the AI models on any of the batches of like data. The CPU, GPU, or DSP runs a copy of each of the AI models for training the AI models in parallel on one or more concepts with the simulators.

In an embodiment, each of the learning agents is further configured to track previous and current simulator states of its corresponding simulator such that the previous and current simulator states can be provided to the instructor module for determining a prediction for each simulation from each simulator that offers a best reward function.

In an embodiment, the instructor module is further configured to update training parameters for each of the AI models; to execute a training curriculum for each of the AI models; to track a training progress for each of the AI models; to start and stop the training for each of the AI modes; and to control the simulators including which one or more simulators of the plurality of simulators to pause until predictions from the predictor module are sent for a corresponding AI model during the training.

In an embodiment, the simulators for respectively training the AI models on the one or more concepts are a mixture of like simulators randomized at different points in time. The mixture of like simulators randomized at different points in time enables the AI engine to provide an optimized training of the AI models.

In an embodiment, the AI engine is configured to train at least 2-8 of the AI models with a respective number of the simulators on a single-enclosure machine as the one or more computer platforms for the optimized training of the AI models.

In an embodiment, the one or more computing platforms are located on premises of an organization. Being on premises of the organization, i) the one or more computing platforms are configurable for one or more users in the organization with at least administrative rights over the one or more computing platforms; ii) the one or more users of the organization are able to physically access the one or more computing platforms; and iii) the hardware components of the one or more computing platforms are connected to each other through a Local Area Network ("LAN"). The LAN is configurable such that the one or more users in the organization have a right to control an operation of the LAN.

Also provided herein, in an embodiment, is a non-transitory computer-readable medium ("CRM") including executable instructions that, when executed on one or more computer platforms with one or more processors including CPUs, GPUs, DSPs, or a combination thereof, cause the one or more computer platforms to instantiate an AI engine and a number of learning agents. The AI engine includes one or more AI-engine modules including an instructor module, a learner module, and a predictor module. Upon execution of the instructor and learner modules by a processor of the one or more processors, the learner module trains a number of AI models in parallel on one or more concepts, and the instructor module coordinates with a number of simulators for respectively training the AI models on the one or more concepts. The learning agents respectively correspond to the number of AI models, and the learning agents process training requests from the instructor on data from the simulators for training the AI models. The learner module initially trains the AI models on a first batch of like or similar data synchronously pooled in a memory of the learner module with a first CPU, GPU, or DSP of the one or more processors, as applicable. The learner module then trains the AI models on a second, different batch of like or similar data synchronously pooled in the memory of the learner module with the first CPU, GPU, or DSP of the one or more processors, as applicable.

In an embodiment, the learning agents categorize i) the simulator experience gatherings, ii) the prediction requests, and iii) the training requests from the multiple simulations to allow data transformation to be handled in an asynchronous way.

In an embodiment, the asynchronous round robin handler checks data batch sizes for batches of like data synchronously pooled in the memory of the learner module and ensures data batch sizes meet or exceed a threshold level. The asynchronous round robin handler checks the data batch sizes before the AI engine commits any CPU, GPU, or DSP of the one or more processors to train the AI models on any of the batches of like data.

In an embodiment, the instructor updates training parameters for each of the AI models; executes a training curriculum for each of the AI models; tracks a training progress for each of the AI models; starts and stops the training for each of the AI modes; and controls the simulators. With respect to controlling the simulators, the simulators pause after sampling until the predictor sends predictions for each of the AI models during the training.

In an embodiment, the learner module, upon execution of the learner module by the one or more processors, is configured to train an AI model. The instructor module, upon execution of the instructor module by the one or more processors, is configured to coordinate with two or more simulations to train the AI model on one or more concepts on this same AI engine in parallel. An instruction classifier/learning agent is configured to group instructions from two or more simulations for training the AI model. A first group of instructions is executed, set by the instruction classifier/learning agent, on a first processor (e.g. CPU, GPU, or DSP, as applicable). A second group of instructions is executed, set by the instruction classifier/learning agent, on, the first processor (e.g. CPU, GPU, or DSP, as applicable). The grouping of instructions from two or more simulations for training the AI model improves a utilization of the instructor module and the first processor, as applicable, over processing the training requests from a single simulation.

In an embodiment, the asynchronous red robin handler includes an asynchronous training thread configured to coordinate resource utilization of the first processor running an instance of the learner and/or the instructor module across multiple simulations occurring in parallel. The asynchronous round robin handler is further configured to stagger steps of a training cycle for each of the two or more simulations utilizing the resources of the first processor.

The steps include:
step 1) obtaining batches of training data,
step 2) utilizing the instructor module,
and at least one of
step 3a) utilizing a predictor module to make predications based off the current
training data, and
step 3b) utilizing the learner module to conduct a training iteration, to maximize the utilization rate of the first CPU, GPU, or DSP.

Algorithm Selection for Training

A first step an AI engine can take is to pick an appropriate learning algorithm to train a mental model. This is a notable step in training AI, and it is a step those without AI expertise cannot perform without expert guidance. The AI engine can have knowledge of many of the available learning algorithms, as well as a set of heuristics for picking an appropriate algorithm including an initial configuration to train from.

The process of picking an appropriate algorithm, etc., can be performed by an AI model that has been trained (and will continue to be trained) by the AI engine, meaning the AI model will get better at building AI models each time a new one is built. A trained AI-engine neural network, such as an AI model, thereby provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building AI models.

The architect module 226 can also use heuristics, mental model signatures, statistical distribution inference, and Meta-learning in topology and algorithm selection.

First, the AI engine and the architect module 226 thereof can be configured to heuristically pick an appropriate learning algorithm from a number of machine learning algorithms in one or more databases for training the neural network proposed by the architect module 226. Many heuristics regarding the mental model can be used to inform what types of AI and machine learning algorithms can be used. For example, the data types used have a large influence. For this reason, the pedagogical programming language contains rich native data types in addition to the basic data types. If the architect module 226 sees, for example, that an image is being used, a convolutional deep learning neural network architecture might be appropriate. If the architect module 226 sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module 226 codebase, and who attempt to capture the heuristics that they themselves use in practice.

In addition to looking at the mental model, the architect module 226 can also consider the pedagogy provided in the pedagogical programming language code. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta-Learning

Meta-learning is an advanced technique used by the architect module 226. It is, as the name implies, learning about learning. What this means is that as the architect module 226 can generate candidate algorithm choices and topologies for training, it can record this data along with the signature for the model and the resultant system performance. This data set can then be used in its own learning system. Thus, the architect module 226, by virtue of proposing, exploring, and optimizing learning models, can observe what works and what does not, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained AI models, v) how quickly the trained AI models were trained to a sufficient level of accuracy, and vi) how accurate the trained AI models became in making predictions on the training data.

For advanced users, low-level details of a learning topology can be explicitly specified completely or in part. The architect module 226 can treat any such pinning of parameters as an override on its default behavior. In this way, specific algorithms can be provided, or a generated model can be pinned for manual refinement.

Guiding Training

The first step the AI engine will take is to pick an appropriate learning algorithm to train the Mental Model. This is a critical step in training AI. The AI engine has knowledge of many of the available learning algorithms and has a set of heuristics for picking an appropriate algorithm as well as an initial configuration to train from.

Once an algorithm is chosen, the AI engine will proceed with training the AI model's Mental Model via the Curricula. The AI engine manages all of the data streaming, data storage, efficient allocation of hardware resources, choosing when to train each concept, how much (or little) to train a concept given its relevance within the Mental Model (i.e. dealing with the common problems of overfitting and underfitting), and generally is responsible for producing a trained AI model based on the given Mental Model and Curricula. As is the case with picking an appropriate learning algorithm, guiding training—notably avoiding overfitting and underfitting—to produce an accurate AI solution is a task that requires knowledge and experience in training AIs. The AI engine has an encoded set of heuristics manage this without user involvement. Similarly, the process of guiding training is also a trained AI model that will only get smarter with each trained AI model it trains. The AI engine is thus configured to make determinations regarding i) when to train the AI model on each of the one or more concepts and ii) how extensively to train the AI model on each of the one or more concepts. Such determinations can be based on the relevance of each of one or more concepts in one or more predictions of a trained AI model based upon training data.

The AI engine can also determine when to train each concept, how much (or little) to train each concept based on its relevance, and, ultimately, produce a trained AI model. Furthermore, the AI engine can utilize meta-learning. In meta-learning, the AI engine keeps a record of each program it has seen, the data it used for training, and the generated AIs that it made. It also records how fast those AIs trained and how accurate they became. The AI engine learns over that dataset.

Note, when training of an AI object occurs, the hyper learner module 228 can be configured to save into the AI database 241 two versions of an AI object. A first version of an AI object is a collapsed tensile flow representation of the AI object. A second version of an AI object is the representation left in its nominal non-collapsed state. When the search engine retrieves the AI object in its nominal non-collapsed state, then another programmer desiring to reuse the AI object will be able to obtain outputs from the non-collapsed graph of nodes with all of its rich meta-data rather and then a collapsed concept with a single discrete output. The state of the AI data objects can be in a non-collapsed state so the trained AI object has its full rich data set, which then may be used by the user for reuse, reconfigured, or recomposed into a subsequent trained AI model.

The database management system also indexes and tracks different AI objects with an indication of what version is this AI object. Later versions of an AI object may be better trained for particular task but earlier versions of the AI object maybe more generally trained; and thus, reusable for wider range of related tasks, to then be further trained for that specific task.

The AI database 241 and other components in the AI engine cooperate to allow migrations of learned state to reconfigure a trained AI object. When a system has undergone substantial training achieving a learned state, and a subsequent change to the underlying mental models might necessitate retraining, it could be desirable to migrate the learned state rather than starting training from scratch. The AI engine can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a trained AI model has been sufficiently trained, it can be deployed such that it can be used in a production application. The interface for using a deployed trained AI model is simple: the user submits data (of the same type as the trained AI model was trained with) to a trained AI model-server API and receives the trained AI model's evaluation of that data.

As a practical example of how to use a deployed trained AI model, a trained AI model can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be down sampled to a resolution of 28×28 and converted to grayscale, as this is the input schema used to train the example trained AI model. When submitted to the trained AI model-server through the trained AI model server API, the trained AI model can take the image as input and output a one-dimensional array of length 10 (whereby each array item represents the probability, as judged by the trained AI model, that the image is a digit corresponding to the index). The array could be the value returned to the user from the API, which the user could use as needed.

Though a linear approach to building a trained AI model is presented in an embodiment, an author-train-deploy workflow does not have to be treated as a waterfall process. If the user decides further refinement of a trained AI model is needed, be it through additional training with existing data, additional training with new, supplemental data, or additional training with a modified version of the mental model or curricula used for training, the AI engine is configured to support versioning of AI models so that the user can preserve (and possibly revert to) the current state of an AI model while refining the trained state of the AI model until a new, more satisfactory state is reached.

Command Line Interface ("CLI")

The CLI is a tool configured to enables users to configure the AI engine. The CLI is especially useful for automation and connection to other tools. Some actions can only be performed using the CLI. Some actions that can be performed using the CLI include loading a pedagogical programming language file and connecting a simulator.

Web Site

The web site is configured as a browser-based tool for configuring and analyzing AI models stored in the AI engine. The website can be used for sharing, collaborating, and learning. Some information that can be accessed from the web site is a visualization of an AI model's training progress.

Network

FIG. 8A provides a schematic illustrating one or more networks in accordance with an embodiment of the AI system 700A, 700B, or 700C described in reference to FIGS. 1A-1C. In such embodiments, the AI system can be, for example, a hybrid AI system 700C between one or more computing platforms located on premises as shown in FIG. 8A (see "Local Private LAN," which includes server 204-S) and one or more cloud-based computing platforms connected over the Internet 202 as further shown in FIG. 8A (see "Bonsai Cloud Platform," which includes server 204-1). In addition, the hybrid configuration or hybrid platform can include a remote site as shown in FIG. 8A (see "remote site #2"). Such a remote site can be accessible to the on-premises installation of the AI engine through a private network 200 or directly or indirectly through the Internet 202.

The multiple independent processes configured to load and execute on the one or more computing platforms of an on-premises installation, which platforms are all connected by a LAN in an AI system such as the AI system 700B of FIG. 1A, are configured such that none of the multiple independent processes send commands for training an AI model to be executed by a cloud-based platform or training data for a simulation over the Internet to be stored on the cloud-based platform.

The multiple independent processes configured to cooperate in a hybrid scenario or hybrid configuration such as the AI system 700C between the one or more computing platforms located on premises and a cloud-based computing platform connected over the Internet are also loaded and executed on the one or more computing platforms located on premises. The one or more computing platforms are also connected by a LAN; however, the multiple independent processes are further configured to send some commands for training the AI model to be executed by the cloud-based computing platform and other commands for training the AI model to the cloud-based computing platform connected over the Internet. As such, the one or more computing platforms connected by the LAN and the cloud-based computing platform form a hybrid cloud-based platform with orchestration between the one or more computing platforms located on premises connected by the LAN and the cloud-based computing platform connected over the Internet. The one or more computing platforms connected by the LAN include edge devices and AI-specific hardware for security and privacy.

FIG. 8B illustrates a number of electronic systems and devices communicating with each other in a network environment in accordance with an embodiment. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In an embodiment, the communications network 820 is the Internet. As shown, there may be many server computing systems and many client computing systems connected to each other via the communications network 820. However, it should be appreciated that, for example, a single client computing system can also be connected to a single server computing system. As such, FIG. 8B illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing system 804A can be, for example, the one or more server systems 220 of FIG. 2. The server computing systems 804A and 804B can each optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like. The client computing system 802B can be, for example, one of the one or more client systems 210, and any one or more of the other client computing systems (e.g., 802A, 802C, 802D, 802E, 802F, 802G, 802H, and/or 804C) can include, for example, the software application or the hardware-based system in which the trained AI model can be deployed. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In an embodiment, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B) or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

FIG. 9 illustrates a computing system 900 that can be, wholly or partially, part of one or more of the server or client computing devices in accordance with an embodiment. With reference to FIG. 9, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 920 of FIG. 9 might not have optical or magnetic storage.

The system memory 930 includes computer storage media in the form of volatile and/or nonvolatile memory such as read only memory (ROM) 931 and random access memory (RAM) 932. A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, FIG. 9 illustrates that RAM 932 can include a portion of the operating system 934, application programs 935, other executable software 936, and program data 937.

The computing system 900 can also include other removable/non-removable volatile/nonvolatile computer storage media. By way of example only, FIG. 9 illustrates a solid-state memory 941. Other removable/non-removable, volatile/nonvolatile computer storage media that can be used in the example operating environment include, but are not limited to, USB drives and devices, flash memory cards, solid state RAM, solid state ROM, and the like. The solid-state memory 941 is typically connected to the system bus 921 through a non-removable memory interface such as interface 940, and USB drive 951 is typically connected to the system bus 921 by a removable memory interface, such as interface 950.

The drives and their associated computer storage media discussed above and illustrated in FIG. 9, provide storage of computer readable instructions, data structures, other executable software and other data for the computing system 900. In FIG. 9, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 9 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, FIG. 9 illustrates remote application programs 985 as residing on remote computing device 980. It will be appreciated that the network connections shown are examples and other means of establishing a communications link between the computing devices may be used.

It should be noted that the present design can be carried out on a computing system such as that described with respect to FIG. 9. However, the present design can be carried out on a server, a computing device devoted to message handling, or on a distributed system in which different portions of the present design are carried out on different parts of the distributed computing system.

In an embodiment, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry.

FIG. 10 provides a block diagram illustrating a method 1000 for parallel training of a number of AI models in accordance with an embodiment.

As shown, the method 1000 includes a first step 1010 of executing instructions causing one or more computer platforms to instantiate an AI engine and a number of learning agents. The AI engine includes one or more AI-engine modules including an instructor module, a learner module, and a predictor module. In a second step 1020, the method 1000 includes executing the instructor module for training a number of AI models in parallel on one or more concepts. The instructor module coordinates with a number of simulators for respectively training the AI models on the one or more concepts. In a third step 1030, the method 1000 includes processing training requests from the instructor with the learning agents on data from the simulators for training the AI models, wherein the learning agents respectively correspond to the number of AI models. In a fourth step 1040, the method 1000 includes executing the learner module for training the AI models on a first batch of like or similar data synchronously pooled in a memory of the learner module with a first CPU, GPU, or DSP of one or more processors. The first CPU, GPU, or DSP of the one or more processors, as appropriate, runs a copy of each of the AI models for training the AI models in parallel on one or more concepts with the simulators. In a fifth step 1050, the method 1000 includes training the AI models with the learner module on a second, different batch of like or similar data synchronously pooled in the memory of the learner module with the first CPU, GPU, or DSP of the one or more processors, and so on.

Executing the instructions of the first step can further cause the one or more computer platforms to instantiate an asynchronous round-robin handler. The asynchronous round-robin handler schedules the training requests; staggers steps of a training cycle for each of the AI models using queues desynchronizing i) simulator experience gatherings, ii) prediction requests, and iii) training requests; and checks data batch sizes for batches of like data synchronously pooled in the memory of the learner module and ensures data batch sizes meet or exceed a threshold level before the AI engine commits any CPU, GPU, or DSP of the one or more processors to train the AI models on any of the batches of like data. As such, the asynchronous round-robin handler coordinates resource utilization of the first CPU, GPU, or DSP.

The learning agents are further configured to categorize the simulator experience gatherings, prediction requests, and training requests to allow data transformation to be handled in an asynchronous way; track dependencies of the data from the simulators for training the AI models, thereby enabling streams of the data from the simulators to be separated into simulator-specific streams; and track previous and current simulator states of corresponding simulators in order to provide the previous and current simulator states to the instructor for determining the prediction that offers a best reward.

The instructor module is further configured to update training parameters for each of the AI models; execute a training curriculum for each of the AI models; track a training progress for each of the AI models; start and stop the training for each of the AI modes; and control the simulators. With respect to controlling the simulators, the simulators pause after sampling until the predictor sends predictions for each of the AI models during the training.

The simulators for respectively training the AI models on the one or more concepts are a mixture of like simulators randomized at different points in time. The mixture of like simulators randomized at different points in time enables the AI engine to provide an optimized training of the AI models. In an embodiment, the AI engine trains at least 8 of the AI models with a respective number of the simulators on a single-enclosure machine as the one or more computer platforms for the optimized training of the AI models.

The one or more computing platforms on which the method 1000 is executed can be located on premises of an organization. Being on premises of the organization, i) the one or more computing platforms are configurable for one or more users in the organization with at least administrative rights over the one or more computing platforms; ii) the one or more users of the organization are able to physically access the one or more computing platforms; and iii) the hardware components of the one or more computing platforms are connected to each other through a Local Area Network ("LAN"). The LAN is configurable such that the one or more users in the organization have a right to control an operation of the LAN.

In a first step of a method of an on-premises installation, the method includes installing multiple independent processes, each wrapped in its own container, onto one or more computing platforms, where the one or more computing platforms are located on-premises of a user's organization. A full set of the containerized multiple independent processes can be used in a standard installation. However, the containerized multiple independent processes can be reduced down to a lower amount than needed by generating a light set for any generic set up and then customizing the installation based on particular needs. A subset of the full set of the containerized independent processes can be used in a limited installation such as on a robot in need of, at most, fine tuning of an initial training of its trained AI model or a device with a fully trained AI model ready for predictions. The containers can be coded to run on different hardware processors found on premises including Intel x86 processors and IBM power8 processors, as well as different operating systems.

In a second step, the method includes determining a number of virtual machines, physical machines, or both physical and virtual machines available in a cluster of the one or more computing platforms located on premises for creating and training AI models with the one or more computing platforms.

In a third step, the method includes allocating network addresses to the machines and copying scripts to the machines for the multiple independent processes.

In a fourth step, the method includes running a first script configured to install the multiple independent processes on the machines for the multiple independent processes.

In a fifth step, the method includes allocating one or more roles to every machine or node thereof in the cluster, the roles for constraining microservices or independent process to certain types of nodes. Allocating the one or more roles to every machine or node thereof in the cluster includes designating one server as a master and any other servers as minions of the master. The method can further include bootstrapping a containerized software daemon on the master and a containerized software daemon on each of the minions. Before bootstrapping the minions, each minion is allocated the one or more roles. Such an on-premises installation of the different processes of the AI engine may occur using a Salt or other similar container as well as the system can be adapted to different configurations of hardware on the customer's premises.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An artificial intelligence ("AI") engine resident on one or more computer platforms including one or more processors, the AI engine comprising:
   one or more AI-engine software modules including an instructor module and a learner module,
      where the learner module is configured to train a plurality of AI models in parallel on one or more AI target concepts specified by a user, and
      where the instructor module is configured to coordinate with a plurality of simulators for respectively training the AI models on the one or more AI target concepts in conjunction with the learner module, wherein instructions from two or more simulations for training the plurality of AI models are grouped to improve a utilization of the instructor module;
   a plurality of software learning agents respectively corresponding to the plurality of AI models, the software learning agents configured to process training requests from the instructor module on data from the plurality of simulators for training the AI models, and
   an asynchronous round robin handler configured to schedule the training requests and coordinate resource utilization of the one or more processors,
   wherein the learner module is further configured to:
      train the plurality of AI models on a first batch of data pooled in a memory of the learner module with a first processor of the one or more processors, based at least in part on determining at the asynchronous round robin handler that a size of the first batch of data meets or exceeds a threshold level,
      train the AI models on a second, different batch of data pooled in the learner module's memory with the first processor of the one or more processors based at least in part on determining at the asynchronous round robin handler that a size of the second, different batch of data meets or exceeds the threshold level, and where any software implemented in the AI engine is stored in one or more machine-readable mediums in an executable format, which can be executed by the one or more processors and the processing of training requests from the instructor module on data from the plurality of simulators for training the AI models improves a utilization of the instructor module and the first processor of the one or more processors, than processing the training requests from a single simulator.

2. The AI engine of claim 1, wherein the asynchronous round robin handler is further configured to stagger steps of a training cycle for each of the AI models using queues that desynchronize i) simulator experience gatherings, ii) prediction requests, and iii) training requests as categorized by the software learning agents to allow data transformation to be handled in an asynchronous way.

3. The AI engine of claim 2, wherein the software learning agents are further configured to track dependencies of the data from the plurality of simulators for training the plurality of AI models, which causes keeping streams of the data from the plurality of simulators separated into simulator-specific streams.

4. The AI engine of claim 1, wherein the asynchronous round robin handler is configured to check data batch sizes for batches of data pooled in the learner module's memory to ensure data batch sizes meet or exceed the threshold level before committing any of the one or more processors for training use for the AI models on any of the batches of data.

5. The AI engine of claim 1, wherein the instructor module is further configured to update training parameters for each of the AI models; to execute a training curriculum for each of the AI models; to track a training progress for each of the AI models; to start and stop the training for each of the AI modes; and to control the simulators including which one or more simulators of the plurality of simulators to pause until predictions from a software predictor module are sent for a corresponding AI model during the training.

6. The AI engine of claim 1, wherein the plurality of simulators for respectively training the AI models on the one or more AI target concepts are a mixture of simulators randomized at different points in time, which causes configuring the AI engine for optimized training of the AI models.

7. The AI engine of claim 6, wherein the AI engine is configured to train at least 8 of the AI models with a respective number of the simulators on a single-enclosure machine as the one or more computer platforms for the optimized training of the AI models.

8. The AI engine of claim 1, wherein the one or more computing platforms are located on premises of an organization such that
i) the one or more computing platforms are configurable for one or more users in the organization with at least administrative rights over the one or more computing platforms;
ii) the one or more users of the organization are able to physically access the one or more computing platforms; and
iii) the hardware components of the one or more computing platforms are connected to each other through a Local Area Network ("LAN"), and the LAN is configurable such that the one or more users in the organization have a right to control an operation of the LAN.

9. A computing system including one or more processors configured to execute instructions that, when executed, cause the computing system to perform the following steps, comprising:

instantiating an artificial intelligence ("AI") engine with one or more AI-engine software modules including an instructor module and a learner module, wherein, upon execution of the instructor module by a first processor and learner module by a second processor of the one or more processors,
the learner module trains a plurality of AI models in parallel on one or more AI target concepts specified by a user, and
the instructor module coordinates with a plurality of simulators for respectively training the AI models on the one or more AI target concepts in conjunction with the learner module, wherein instructions from two or more simulations for training the plurality of AI models are grouped to improve a utilization of the instructor module; and instantiating a plurality of software learning agents respectively corresponding to the plurality of AI models, instantiating an asynchronous round robin handler to schedule training requests from the instructor module and coordinate resource utilization of the one or more processors, wherein the software learning agents process the training requests from the instructor module on data from the simulators for training the AI models, wherein the learner module first trains the AI models on a first batch of data pooled in a memory of the learner module with the first processor of the one or more processors based at least in part on determining at the asynchronous round robin handler that a size of the first batch of data meets or exceeds a threshold level, and wherein the learner module subsequently trains the AI models on a second, different batch of data pooled in the learner module's memory with the second processor of the one or more processors, based at least in part on determining at the asynchronous round robin handler that a size of the second, different batch of data meets or exceeds the threshold level.

10. The computing system of claim 9, wherein the asynchronous round robin handler staggers steps of a training cycle for each of the AI models using queues that desynchronize i) simulator experience gatherings, ii) prediction requests, and iii) training requests as categorized by the software learning agents to allow data transformation to be handled in an asynchronous way.

11. The computing system of claim 10,
wherein the software learning agents track dependencies of the data from the plurality of simulators for training the plurality of AI models, which causes keeping streams of the data from the plurality of simulators separated into simulator-specific streams.

12. The computing system of claim 9,
wherein the asynchronous round robin handler checks data batch sizes for batches of data pooled in the learner module's memory and ensures data batch sizes meet or exceed the threshold level before committing any of the one or more processors for training use for the AI models on any of the batches of data.

13. The computing system of claim 9,
wherein the instructor module updates training parameters for each of the AI models; executes a training curriculum for each of the AI models; tracks a training progress for each of the AI models; starts and stops the training for each of the AI modes; and controls the simulators, which simulators pause until predictions from a software predictor module are sent for each of the AI models during the training.

14. The computing system of claim 9,
wherein the simulators for respectively training the AI models on the one or more AI target concepts are a mixture of simulators randomized at different points in time, which causes configuring the AI engine for optimized training of the AI models.

15. An artificial intelligence ("AI") engine resident on one or more computer platforms including one or more processors, the AI engine comprising:
one or more AI-engine software modules including an instructor module, and a learner module,
wherein the learner module, upon execution of the learner module by the one or more processors, is configured to train an AI model,
wherein the instructor module, upon execution of the instructor module by the one or more processors, is configured to coordinate with two or more simulations to train the AI model on one or more AI target concepts in conjunction with the learner module on this same AI engine in parallel, such that instructions from two or more simulations for training the AI model are grouped, the one or more AI target concepts specified by a user;
an asynchronous round robin handler including an asynchronous training thread configured to coordinate resource utilization of the one or more processors running instances of the learner module and the instructor module across multiple simulations occurring in parallel based at least in part on a size of a data batch pooled in a memory of the learner module; and
an instruction classifier/learning agent configured to
group instructions from two or more simulations for training the AI model,
execute a first group of instructions set by the instruction classifier/learning agent on a first processor,
execute a second group of instructions set by the instruction classifier/learning agent on the first processor, and
where any software implemented in the AI engine is stored in one or more machine-readable mediums in an executable format, which can be executed by the one or more processors and the grouping of instructions from two or more simulations for training the AI model improves a utilization of the instructor module and the first processor of the one or more processors, than processing the training requests from a single simulation.

16. The AI engine of claim 15,
wherein the asynchronous round robin handler is further configured to stagger steps of a training cycle for each of the two or more simulations utilizing the resources of the first processor, the steps including
step 1) obtaining batches of training data,
step 2) utilizing the instructor module, and at least one of
step 3a) utilizing a software predictor module to make predications based off the current training data, and
step 3b) utilizing the learner module to conduct a training iteration,
to maximize the utilization rate of the one or more processors.

* * * * *